US011953559B2

(12) United States Patent
Mangell et al.

(10) Patent No.: US 11,953,559 B2
(45) Date of Patent: Apr. 9, 2024

(54) SECURE SYSTEM THAT INCLUDES DRIVING RELATED SYSTEMS

(71) Applicant: Mobileye Vision Technologies Ltd., Jerusalem (IL)

(72) Inventors: Efraim Mangell, Jerusalem (IL); Elchanan Rushinek, Neve Yarak (IL); Leonid Smolyansky, Zichron Ya'akov (IL); Giora Yorav, Haifa (IL)

(73) Assignee: Mobileye Vision Technologies Ltd., Jerusalem (IL)

( * ) Notice: Subject to any disclaimer, the term of this patent is extended or adjusted under 35 U.S.C. 154(b) by 669 days.

(21) Appl. No.: 17/053,116

(22) PCT Filed: May 28, 2019

(86) PCT No.: PCT/IB2019/000685
§ 371 (c)(1),
(2) Date: Nov. 5, 2020

(87) PCT Pub. No.: WO2019/229534
PCT Pub. Date: Dec. 5, 2019

(65) Prior Publication Data
US 2021/0141030 A1    May 13, 2021

Related U.S. Application Data

(60) Provisional application No. 62/677,067, filed on May 28, 2018.

(51) Int. Cl.
*G01R 31/54* (2020.01)
*G01R 31/00* (2006.01)
*G01R 31/70* (2020.01)

(52) U.S. Cl.
CPC ........... *G01R 31/54* (2020.01); *G01R 31/006* (2013.01); *G01R 31/70* (2020.01)

(58) Field of Classification Search
CPC ....... G01R 31/54; G01R 31/70; G01R 31/006
See application file for complete search history.

(56) References Cited

U.S. PATENT DOCUMENTS

2012/0159241 A1    6/2012  Nishijima et al.
2015/0108996 A1*   4/2015  Vaucher ............. G01R 31/2822
                                                        324/537

FOREIGN PATENT DOCUMENTS

JP     2018040278 A      3/2018
WO     WO-2018193449 A1  10/2018
WO     WO-2019229534 A2  12/2019

OTHER PUBLICATIONS

"International Application Serial No. PCT/IB2019/000685, International Search Report dated Feb. 25, 2020", 2 pgs.

(Continued)

*Primary Examiner* — Zoheb S Imtiaz
(74) *Attorney, Agent, or Firm* — Schwegman Lundberg & Woessner, P.A.

(57) ABSTRACT

A driving related system that may include an integrated circuit (IC) that may include IC conductors and test unit; a PCB that may include PCB conductors; intermediate conductors for coupling the IC conductors to the PCB conductors; wherein the test unit is configured to: electrically test a continuity of a first conductive path that comprises a first group of intermediate conductors, a first group of IC conductors and a first group of PCB conductors; and generate a continuity fault indication when detecting a discontinuity of the first conductive path; and wherein the driving related system is configured to perform a safety measure, in response to a generation of one or more continuity fault indications.

20 Claims, 19 Drawing Sheets

(56) References Cited

OTHER PUBLICATIONS

"International Application Serial No. PCT/IB2019/000685, Written Opinion dated Feb. 25, 2020", 6 pgs.
"International Application Serial No. PCT IB2019 000685, International Preliminary Report on Patentability dated Dec. 10, 2020", 8 pgs.

* cited by examiner

TO TEST UNIT OF IC

```
                                                                    ┌─ 1500
                                                                    ▽

┌─────────────────────────────────────────────────────────────────────────┐
│ ELECTRICALLY TESTING, BY A TEST UNIT OF AN INTEGRATED CIRCUIT (IC) A    │
│ CONTINUITY OF A FIRST CONDUCTIVE PATH THAT COMPRISES A FIRST GROUP      │──1510
│ OF IC CONDUCTORS, A FIRST GROUP OF PRINTED CIRCUIT BOARD (PCB)          │
│ CONDUCTORS, AND A FIRST GROUP OF INTERMEDIATE CONDUCTORS THAT           │
│ COUPLE THE FIRST GROUP OF IC CONDUCTORS TO THE FIRST GROUP OF PCB       │
│ CONDUCTORS                                                              │
└─────────────────────────────────────────────────────────────────────────┘
                                     │
                                     ▼
┌─────────────────────────────────────────────────────────────────────────┐
│ GENERATING, BY THE TEST UNIT, A CONTINUITY FAULT INDICATION WHEN        │──1520
│ DETECTING A DISCONTINUITY OF THE FIRST CONDUCTIVE PATH                  │
└─────────────────────────────────────────────────────────────────────────┘
                                     │
                                     ▼
┌─────────────────────────────────────────────────────────────────────────┐
│ PERFORMING, BY A DRIVING RELATED SYSTEM, A SAFETY MEASURE, IN           │──1530
│ RESPONSE TO THE CONTINUITY FAULT INDICATION                             │
└─────────────────────────────────────────────────────────────────────────┘
```

*FIG. 15*

SECURE SYSTEM THAT INCLUDES DRIVING RELATED SYSTEMS

CLAIM OF PRIORITY

This patent application U.S. National Stage Application under 35 U.S.C. 371 from International Application No. PCT/IB2019/000685, filed May 28, 2019, which claims the benefit of priority to U.S. Provisional Patent Application Ser. No. 62/677,067 filed on May 28, 2018, all of which are incorporated herein by reference in their entirety.

BACKGROUND

A driving related system may perform various driving related tasks such as autonomous navigation, autonomous driving, driver assist operations, and the like. Driver assist operations may assist drivers in the navigation and/or control of their vehicles, such as with forward collision warning (FCW), lane departure learning (LDW), and traffic sign recognition (TSR) systems. A driving related system may include an integrated circuit (IC) that is mounted on a printed circuit board (PCB). When using surface mounting technology (SMT) solder balls are positioned between the IC and the PCB—and are used to electrically couple IC conductors to PCB conductors. A driving related system, when installed in a vehicle (or be otherwise attached to the vehicle) is subjected to mechanical forces, and electrical and thermal stress. For safety, functionality and reliability reasons, it is good to evaluate the integrity of the driving related system during the lifespan of the driving related system.

SUMMARY

The following detailed description refers to the accompanying drawings. Wherever possible, the same reference numbers are used in the drawings and the following description to refer to the same or similar parts. While several illustrative embodiments are described herein, modifications, adaptations and other implementations are possible. For example, substitutions, additions, or modifications may be made to the components illustrated in the drawings, and the illustrative methods described herein may be modified by substituting, reordering, removing, or adding steps to the disclosed methods. Accordingly, the following detailed description may be not limited to the disclosed embodiments and examples.

Disclosed embodiments provide systems and methods that can be used as part of or in combination with autonomous navigation/driving and/or driver assist technology features. Driver assist technology refers to any suitable technology to assist drivers in the navigation and/or control of their vehicles, such as FCW, LDW, and TSR, as opposed to fully autonomous driving.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 15 illustrates a method.

DETAILED DESCRIPTION

Figure 1:
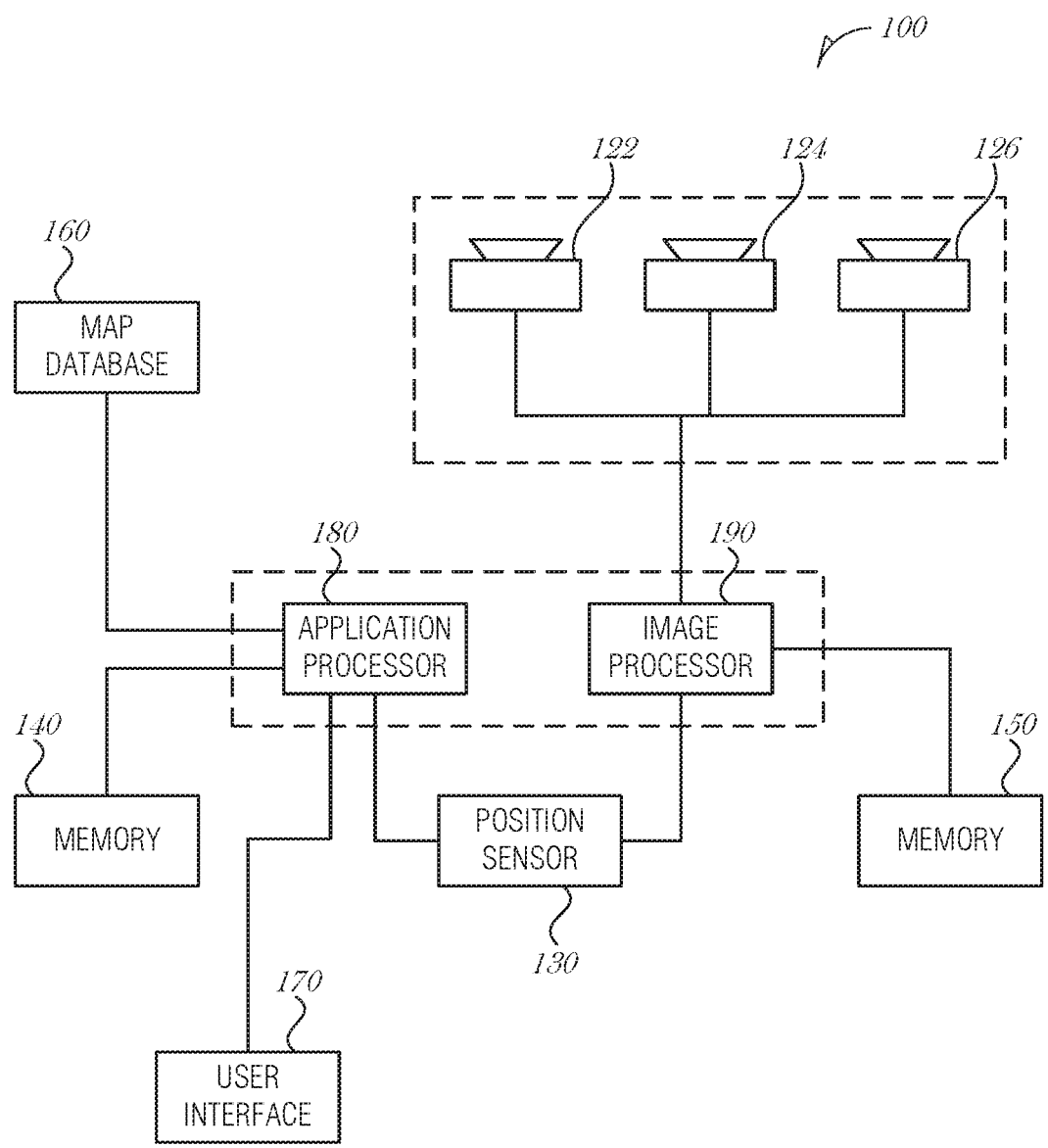
FIG. 1 is a block diagram representation of a system consistent with the disclosed embodiments.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

A description of various possible implementations and configurations of a vehicle mountable system that can be used for carrying out and implementing the methods according to examples of the presently disclosed subject matter are described below. Such a vehicle mountable system may be used to processing images, of an environment ahead of a vehicle navigating a road, for training a neural networks or deep learning algorithms to estimate a future path of a vehicle or use by a trained neural network to estimate a future path of the vehicle. In some embodiments, various examples, the system can be mounted in a vehicle and operated while the vehicle is in motion.

FIG. 1, to which reference is now made, is a block diagram representation of a system consistent with the disclosed embodiments. System 100 can include various components depending on the requirements of a particular implementation. In some examples, system 100 can include a processing unit 110, an image acquisition unit 120 and one or more memory units 140, 150. Processing unit 110 can include one or more processing devices. In some embodiments, processing unit 110 can include an application processor 180, an image processor 190, or any other suitable processing device. Similarly, image acquisition unit 120 can include any number of image acquisition devices and components depending on the requirements of a particular application. In some embodiments, image acquisition unit 120 can include one or more image capture devices (e.g., cameras), such as image capture device 122, image capture device 124, and image capture device 126. In some embodiments, system 100 can also include a data interface 128 communicatively connecting processing unit 110 to image acquisition device 120. For example, data interface 128 can include any wired and/or wireless link or links for transmitting image data acquired by image acquisition device 120 to processing unit 110.

Both application processor 180 and image processor 190 can include various types of processing devices. For example, either or both of application processor 180 and image processor 190 can include one or more microprocessors, preprocessors (such as image preprocessors), graphics processors, central processing units (CPUs), support circuits, digital signal processors, integrated circuits, memory, or any other types of devices suitable for running applications and for image processing and analysis. In some embodiments, application processor 180 and/or image processor 190 can include any type of single or multi-core processor, mobile device microcontroller, central processing unit, etc.

The application processor 180 and/or the image processor 190 and/or the entire processing unit 110 may be included in one or more ICs that are mounted on one or more PCBs. Conductors of the one or more PCBs, intermediate conductors between the PCB and the one or more ICs may form one or more conductive paths that are electrically tested (e.g., checking their continuity) by one or more test units—for example, by one or more test units included in the one or more ICs and/or attached to the PCB in any other manner.

In some embodiments, application processor 180 and/or image processor 190 can include any of the EyeQ series of processor chips available from Mobileye®. These processor designs each include multiple processing units with local memory and instruction sets. Such processors may include video inputs for receiving image data from multiple image sensors and may also include video out capabilities. In one example, the EyeQ2® uses 90 nm-micron technology operating at 332 Mhz. The EyeQ2® architecture has two floating point, hyper-thread 32-bit RISC CPUs (MIPS32® 34K® cores), five Vision Computing Engines (VCE), three Vector Microcode Processors (VMP®), Denali 64-bit Mobile DDR Controller, 128-bit internal Sonics Interconnect, dual 16-bit Video input and 18-bit Video output controllers, 16 channels DMA and several peripherals. The MIPS34K CPU manages the five VCEs, three VMP.™ the DMA, the second MIPS34K CPU, and the multi-channel DMA as well as the other peripherals. The five VCEs, three VMP® and the MIPS34K CPU can perform intensive vision computations required by multi-function bundle applications. In another example, the EyeQ3®, which is a third-generation processor and is six times more powerful that the EyeQ2®, may be used in the disclosed examples. In yet another example, the EyeQ4®, the fourth-generation processor or any further generation chip, may be used in the disclosed examples.

While FIG. 1 depicts two separate processing devices included in processing unit 110, more or fewer processing devices can be used. For example, in some examples, a single processing device may be used to accomplish the tasks of application processor 180 and image processor 190. In other embodiments, these tasks can be performed by more than two processing devices.

Processing unit 110 can include various types of devices. For example, processing unit 110 may include various devices, such as a controller, an image preprocessor, a central processing unit (CPU), support circuits, digital signal processors, integrated circuits, memory, or any other types of devices for image processing and analysis. The image preprocessor can include a video processor for capturing, digitizing and processing the imagery from the image sensors. The CPU can include any number of microcontrollers or microprocessors. The support circuits can be any number of circuits generally well known in the art, including cache, power supply, clock and input-output circuits. The memory can store software that, when executed by the processor, controls the operation of the system. The memory can include databases and image processing software, including a trained system, such as a neural network, for example. The memory can include any number of random access memories, read only memories, flash memories, disk drives, optical storage, removable storage and other types of storage. In one instance, the memory can be separate from the processing unit 110. In another instance, the memory can be integrated into the processing unit 110.

Each memory 140, 150 can include software instructions that when executed by a processor (e.g., application processor 180 and/or image processor 190), can control operation of various aspects of system 100. These memory units 140, 150 can include various databases and image processing software. The memory units 140, 150 can include random access memory, read only memory, flash memory, disk drives, optical storage, tape storage, removable storage and/or any other types of storage. In some examples, memory units 140, 150 can be separate from the application processor 180 and/or image processor 190. In other embodiments, these memory units 140, 150 can be integrated into application processor 180 and/or image processor 190.

In some embodiments, the system 100 can include a position sensor 130. The position sensor 130 can include any type of device suitable for determining a location associated with at least one component of system 100. In some embodiments, position sensor 130 can include a GPS receiver. Such receivers can determine a user position and velocity by processing signals broadcasted by global positioning system satellites. Position information from position sensor 130 can be made available to application processor 180 and/or image processor 190.

In some embodiments, the system 100 can be operatively connectible to various systems, devices, and units onboard a vehicle in which the system 100 can be mounted, and through any suitable interfaces (e.g., a communication bus) the system 100 can communicate with the vehicle's systems. Examples of vehicle systems with which the system 100 can cooperate include: a throttling system, a braking system, and a steering system.

In some embodiments, the system 100 can include a user interface 170. User interface 170 can include any device suitable for providing information to or for receiving inputs from one or more users of system 100, including, for example, a touchscreen, microphone, keyboard, pointer devices, track wheels, cameras, knobs, buttons, etc. Information can be provided by the system 100, through the user interface 170, to the user.

In some embodiments, the system 100 can include a map database 160. The map database 160 can include any type of database for storing digital map data. In some examples, map database 160 can include data relating to a position, in a reference coordinate system, of various items, including roads, water features, geographic features, points of interest, etc. Map database 160 can store not only the locations of such items, but also descriptors relating to those items, including, for example, names associated with any of the stored features and other information about them. For example, locations and types of known obstacles can be included in the database, information about a topography of a road or a grade of certain points along a road, etc. In some embodiments, map database 160 can be physically located with other components of system 100. Alternatively, or additionally, map database 160 or a portion thereof can be located remotely with respect to other components of system 100 (e.g., processing unit 110). In such embodiments, information from map database 160 can be downloaded over a wired or wireless data connection to a network (e.g., over a cellular network and/or the Internet, etc.).

Image capture devices 122, 124, and 126 can each include any type of device suitable for capturing at least one image from an environment. Moreover, any number of image capture devices can be used to acquire images for input to the image processor. Some examples of the presently disclosed subject matter can include or can be implemented with only a single-image capture device, while other examples can include or can be implemented with two, three, or even four or more image capture devices. Image capture devices 122, 124, and 126 will be further described with reference to FIGS. 2B-2E, below.

It would be appreciated that the system 100 can include or can be operatively associated with other types of sensors, including for example: an acoustic sensor, a RF sensor (e.g., radar transceiver), or a LIDAR sensor. Such sensors can be used independently of, or in cooperation with, the image acquisition device 120. For example, the data from the radar system (not shown) can be used for validating the processed information that is received from processing images acquired by the image acquisition device 120—such as filtering certain false positives resulting from processing images acquired by image acquisition device 120—or it can be combined with or otherwise compliment the image data from the image acquisition device 120, or some processed variation or derivative of the image data from the image acquisition device 120.

Figure 2A:
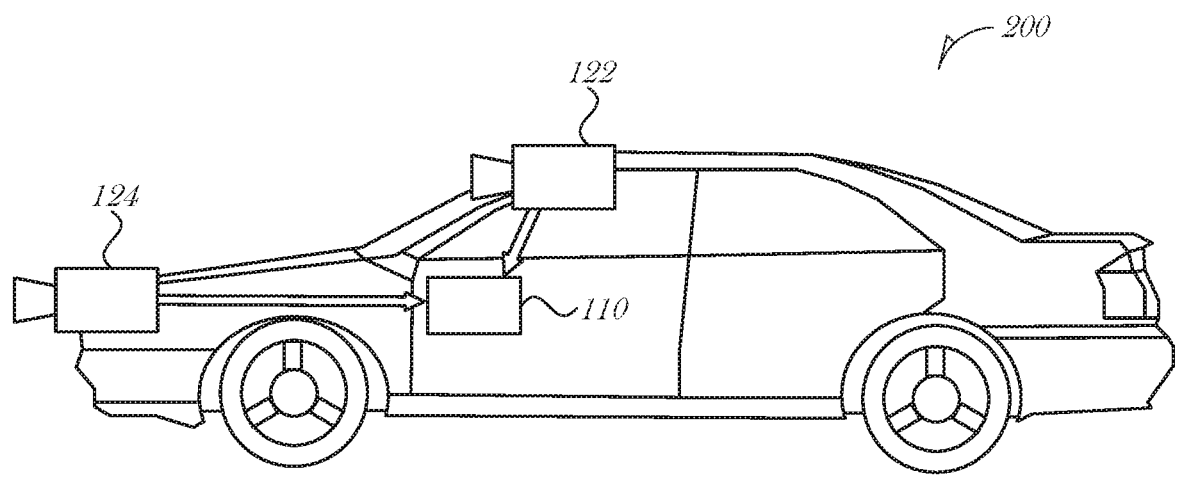
FIG. 2A is a diagrammatic side view representation of an exemplary vehicle including a system consistent with the disclosed embodiments.

System 100, or various components thereof, can be incorporated into various different platforms. In some embodiments, system 100 may be included on a vehicle 200, as shown in FIG. 2A. For example, vehicle 200 can be equipped with a processing unit 110 and any of the other components of system 100, as described above relative to FIG. 1. While in some embodiments vehicle 200 can be equipped with only a single-image capture device (e.g., camera), in other embodiments, such as those discussed in connection with FIGS. 2B-2E, multiple image capture devices can be used. For example, either of image capture devices 122 and 124 of vehicle 200, as shown in FIG. 2A, can be part of an ADAS (Advanced Driver Assistance Systems) imaging set.

The image capture devices included on vehicle 200 as part of the image acquisition unit 120 can be positioned at any suitable location. In some embodiments, as shown in FIGS. 2A-2E and 3A-3C, image capture device 122 can be located in the vicinity of the rearview mirror. This position may provide a line of sight similar to that of the driver of vehicle 200, which can aid in determining what is and is not visible to the driver.

Other locations for the image capture devices of image acquisition unit 120 can also be used. For example, image capture device 124 can be located on or in a bumper of vehicle 200. Such a location can be especially suitable for image capture devices having a wide field of view. The line of sight of bumper-located image capture devices can be different from that of the driver. The image capture devices (e.g., image capture devices 122, 124, and 126) can also be located in other locations. For example, the image capture devices may be located on or in one or both of the side mirrors of vehicle 200, on the roof of vehicle 200, on the hood of vehicle 200, on the trunk of vehicle 200, on the sides of vehicle 200, mounted on, positioned behind, or positioned in front of any of the windows of vehicle 200, and mounted in or near light fixtures on the front and/or back of vehicle 200, etc. The image capture unit 120, or an image capture device that is one of a plurality of image capture devices that are used in an image capture unit 120, can have a field-of-view (FOV) that is different than the FOV of a driver of a vehicle, and not always see the same objects. In one example, the FOV of the image acquisition unit 120 can extend beyond the FOV of a typical driver and can thus image objects which are outside the FOV of the driver. In yet another example, the FOV of the image acquisition unit 120 is some portion of the FOV of the driver. In some embodiments, the FOV of the image acquisition unit 120 corresponding to a sector which covers an area of a road ahead of a vehicle and possibly also surroundings of the road.

In addition to image capture devices, vehicle 200 can be include various other components of system For example, processing unit 110 may be included on vehicle 200 either integrated with or separate from an engine control unit (ECU) of the vehicle. Vehicle 200 may also be equipped with a position sensor 130, such as a GPS receiver and may also include a map database 160 and memory units 140 and 150.

Figure 2B:
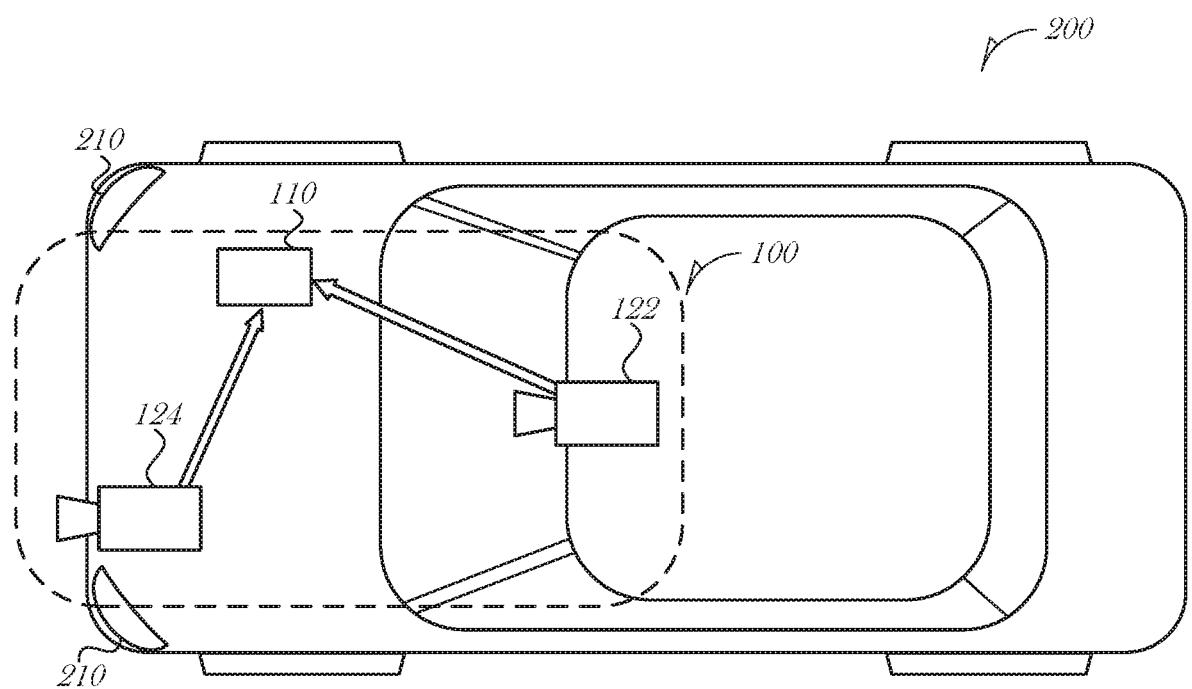
FIG. 2B is a diagrammatic top view representation of the vehicle consistent with the disclosed embodiments.

FIG. 2A is a diagrammatic side view representation of a vehicle imaging system according to examples of the presently disclosed subject matter. FIG. 2B is a diagrammatic top view illustration of the example shown in FIG. 2A. As illustrated in FIG. 2B, the disclosed examples can include a vehicle 200 including in its body a system 100 with a first image capture device 122 positioned in the vicinity of the rearview mirror and/or near the driver of vehicle 200, a second image capture device 124 positioned on or in a bumper region (e.g., one of bumper regions 290) of vehicle 200, and a processing unit 110.

Figure 2C:
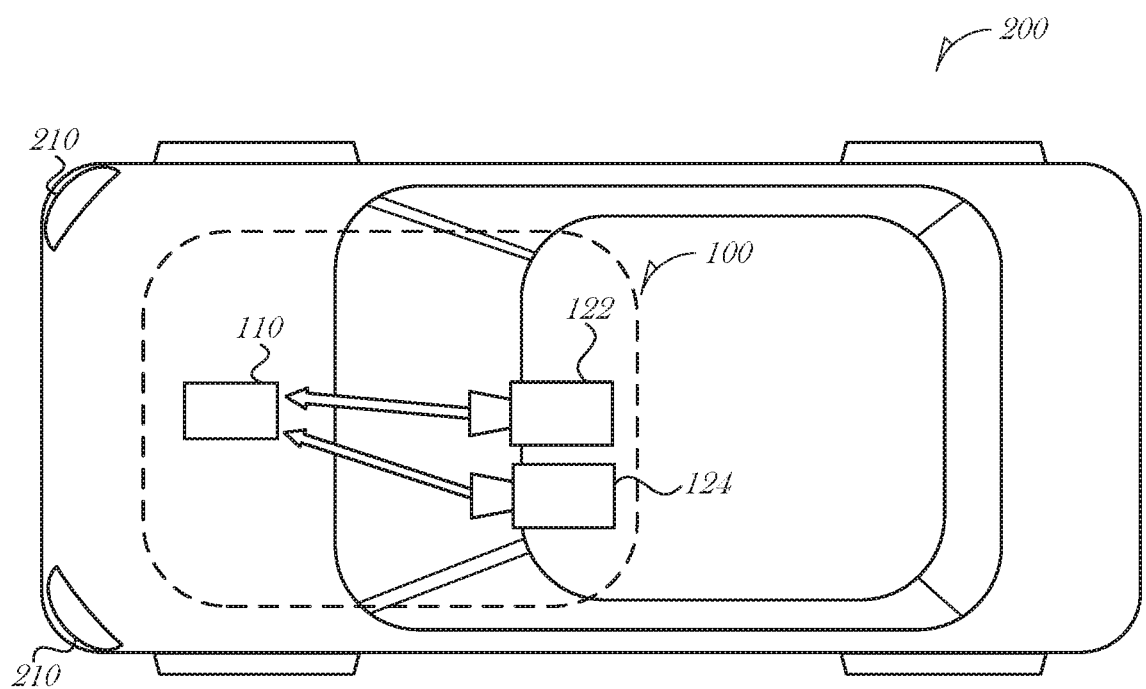
FIG. 2C is a diagrammatic top view representation of another embodiment of the vehicle including a system consistent with the disclosed embodiments.

As illustrated in FIG. 2C, image capture devices 122 and 124 may both be positioned in the vicinity of the rearview mirror and/or near the driver of vehicle 200. Additionally, while two image capture devices 122 and 124 are shown in FIGS. 2B and 2C, other embodiments may include more than two image capture devices. For example, in the embodiment shown in FIG. 2D, first, second, and third image capture devices 122, 124, and 126, are included in the system 100 of vehicle 200.

Figure 2D:
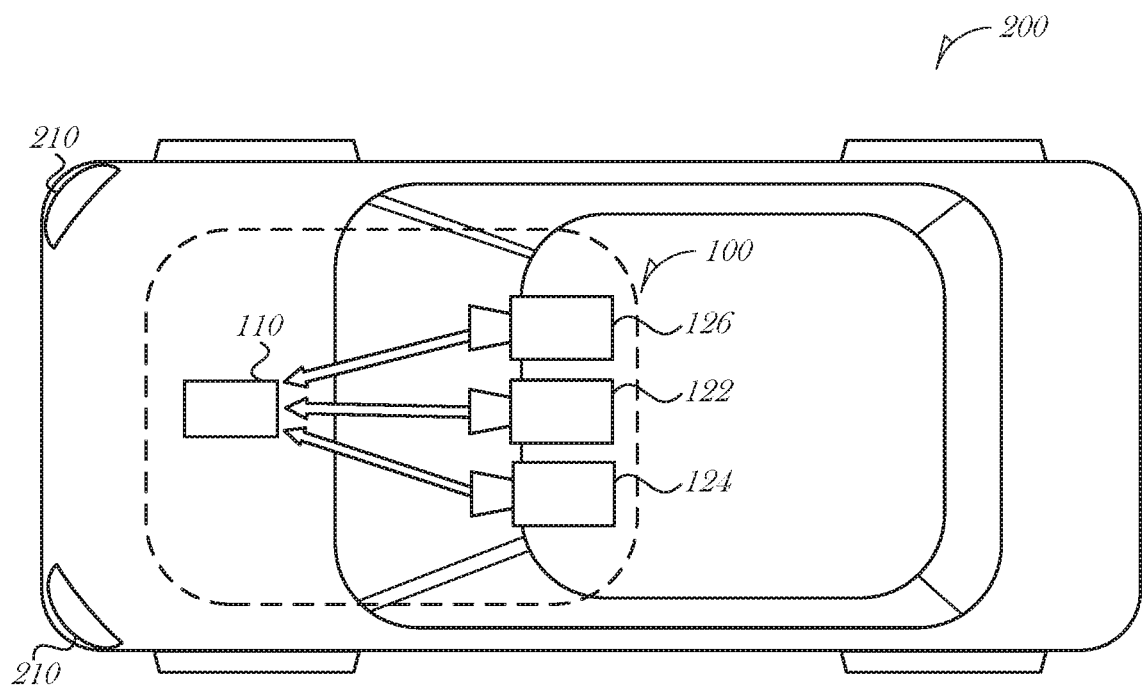
FIG. 2D is a diagrammatic top view representation of yet another embodiment of the vehicle including a system consistent with the disclosed embodiments.

As shown in FIG. 2D, image capture devices 122, 124, and 126 may be positioned in the vicinity of the rearview mirror and/or near the driver seat of vehicle 200. The disclosed examples are not limited to any particular number and configuration of the image capture devices, and the image capture devices may be positioned in any appropriate location within and/or on vehicle 200.

It is also to be understood that disclosed embodiments are not limited to a particular type of vehicle 200 and may be applicable to all types of vehicles including automobiles, trucks, trailers, motorcycles, bicycles, self-balancing transport devices and other types of vehicles.

The first image capture device 122 can include any suitable type of image capture device. Image capture device 122 can include an optical axis. In one instance, the image capture device 122 can include an Aptina M9V024 WVGA sensor with a global shutter. In another example, a rolling shutter sensor can be used. Image acquisition unit 120, and any image capture device which is implemented as part of the image acquisition unit 120, can have any desired image resolution. For example, image capture device 122 can provide a resolution of 1280×960 pixels and can include a rolling shutter.

Image acquisition unit 120, and any image capture devices that are implemented as part of the image acquisition unit 120, can include various optical elements. In some embodiments, one or more lenses can be included, for example, to provide a desired focal length and field of view for the image acquisition unit 120, and for any image capture device which is implemented as part of the image acquisition unit 120. In some examples, an image capture device which is implemented as part of the image acquisition unit 120 can include or be associated with any optical elements, such as a 6 mm lens or a 12 mm lens, for example. In some examples, image capture device can be configured to capture images having a desired (and known) field-of-view (FOV).

The first image capture device 122 may have a scan rate associated with acquisition of each of the first series of image scan lines. The scan rate may refer to a rate at which an image sensor can acquire image data associated with each pixel included in a particular scan line.

Figure 2E:
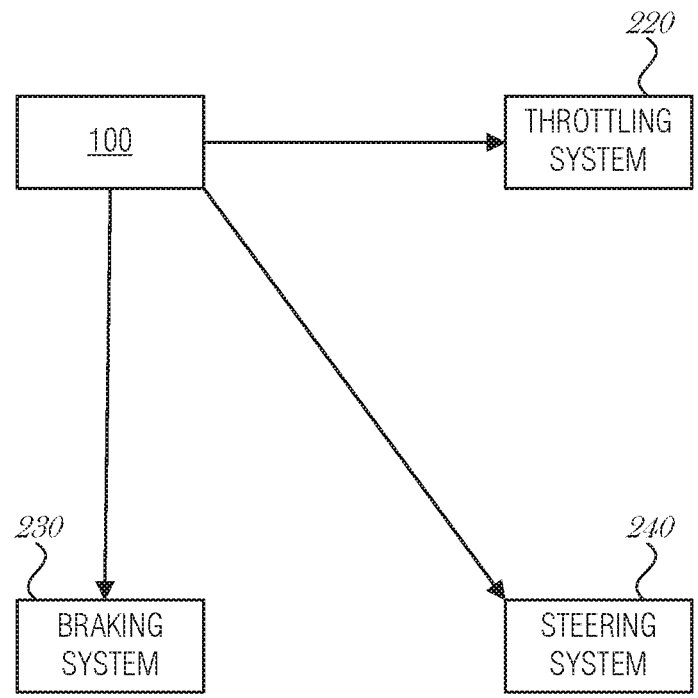
FIG. 2E is a diagrammatic representation of exemplary vehicle control systems consistent with the disclosed embodiments.

FIG. 2E is a diagrammatic representation of vehicle control systems, according to examples of the presently disclosed subject matter. As indicated in FIG. 2E, vehicle 200 can include throttling system 220, braking system 230, and steering system 240. System 100 can provide inputs (e.g., control signals) to one or more of throttling system 220, braking system 230, and steering system 240 over one or more data links (e.g., any wired and/or wireless link or links for transmitting data). For example, based on analysis of images acquired by image capture devices 122, 124, and/or 126, system 100 can provide control signals to one or more of throttling system 220, braking system 230, and steering system 240 to navigate vehicle 200 (e.g., by causing an acceleration, a turn, a lane shift, etc.). Further, system 100 can receive inputs from one or more of throttling system 220, braking system 230, and steering system 240 indicating operating conditions of vehicle 200 (e.g., speed, whether vehicle 200 is braking and/or turning, etc.).

Figure 3:
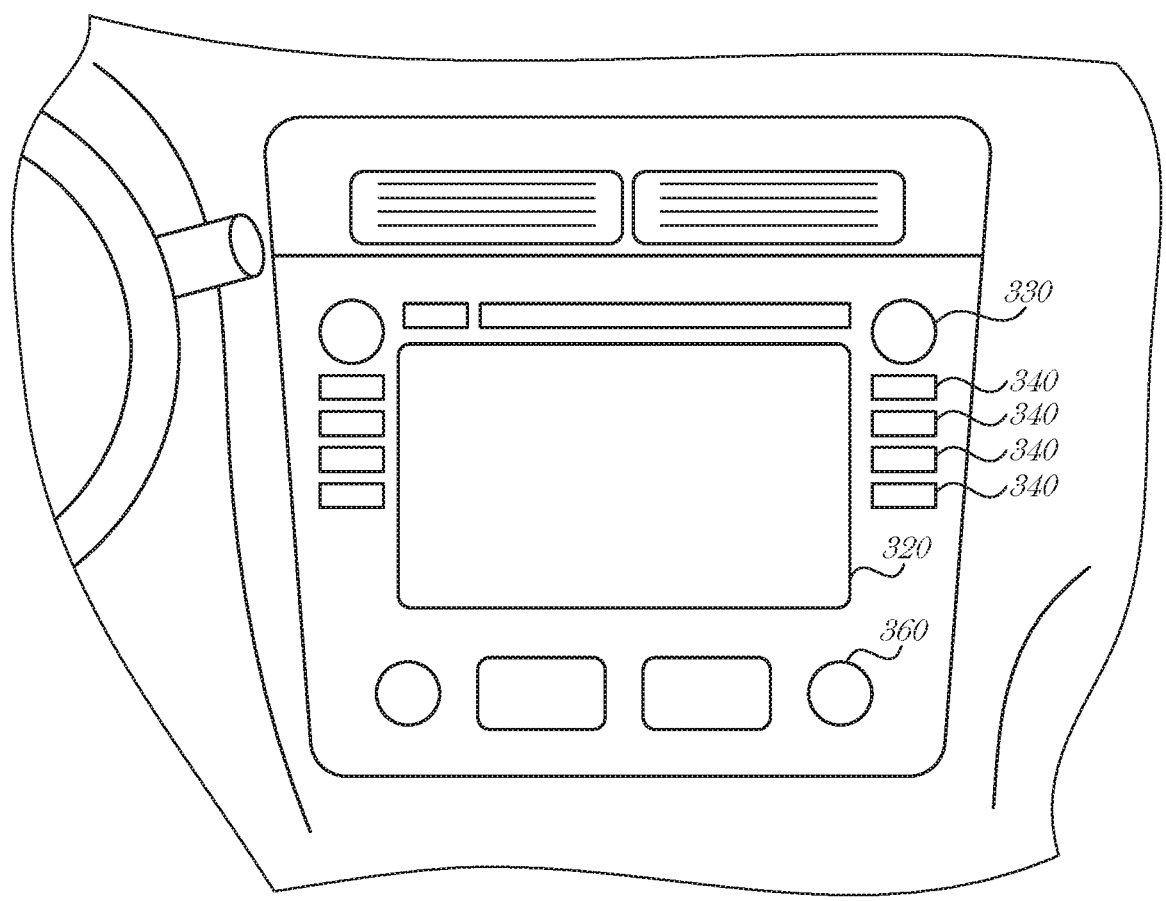
FIG. 3 is a diagrammatic representation of an interior of a vehicle including a rearview mirror and a user interface for a vehicle imaging system consistent with the disclosed embodiments.

As shown in FIG. 3, vehicle 200 may also include a user interface 170 for interacting with a driver or a passenger of vehicle 200. For example, user interface 170 in a vehicle application may include a touch screen 320, knobs 330, buttons 340, and a microphone 350. A driver or passenger of vehicle 200 may also use handles (e.g., located on or near the steering column of vehicle 200 including, for example, turn signal handles), buttons (e.g., located on the steering wheel of vehicle 200), and the like, to interact with system 100. In some embodiments, microphone 350 may be positioned adjacent to a rearview mirror 310. Similarly, in some embodiments, image capture device 122 may be located near rearview mirror 310. In some embodiments, user interface 170 may also include one or more speakers 360 (e.g., speakers of a vehicle audio system). For example, system 100 may provide various notifications (e.g., alerts) via speakers 360.

As will be appreciated by a person skilled in the art having the benefit of this disclosure, numerous variations and/or modifications may be made to the foregoing disclosed embodiments. For example, not all components are essential for the operation of system 100. Further, any component may be located in any appropriate part of system 100 and the components may be rearranged into a variety of configurations while providing the functionality of the disclosed embodiments. Therefore, the foregoing configurations are examples and, regardless of the configurations discussed above, system 100 can provide a wide range of functionality to analyze the surroundings of vehicle 200 and, in response to this analysis, navigate and/or otherwise control and/or operate vehicle 200. Navigation, control, and/or operation of vehicle 200 may include enabling and/or disabling (directly or via intermediary controllers, such as the controllers mentioned above) various features, components, devices, modes, systems, and/or subsystems associated with vehicle 200. Navigation, control, and/or operation may alternately or additionally include interaction with a user, driver, passenger, passerby, and/or other vehicle or user, which may be located inside or outside vehicle 200, for example by providing visual, audio, haptic, and/or other sensory alerts and/or indications.

As discussed below in further detail and consistent with various disclosed embodiments, system 100 may provide a variety of features related to autonomous driving, semi-autonomous driving and/or driver assist technology. For example, system 100 may analyze image data, position data (e.g., GPS location information), map data, speed data, and/or data from sensors included in vehicle 200. System 100 may collect the data for analysis from, for example, image acquisition unit 120, position sensor 130, and other sensors. Further, system 100 may analyze the collected data to determine whether or not vehicle 200 should take a certain action, and then automatically take the determined action without human intervention. It would be appreciated that in some cases, the actions taken automatically by the vehicle are under human supervision, and the ability of the human to intervene, adjust, abort, or override the machine action is enabled under certain circumstances or at all times. For example, when vehicle 200 navigates without human intervention, system 100 may automatically control the braking, acceleration, and/or steering of vehicle 200 (e.g., by sending control signals to one or more of throttling system 220, braking system 230, and steering system 240). Further, system 100 may analyze the collected data and issue warnings, indications, recommendations, alerts, or instructions to a driver, passenger, user, or other person inside or outside of the vehicle (or to other vehicles) based on the analysis of the collected data. Additional details regarding the various embodiments that are provided by system 100 are provided below.

Multi-Imaging System

As discussed above, system 100 may provide driver assist functionality, or semi-autonomous driving functionality, or fully autonomous driving functionality using a single or a multi-camera system. The multi-camera system may use one or more cameras facing in the forward direction of a vehicle. In other embodiments, the multi-camera system may include one or more cameras facing to the side of a vehicle or to the rear of a vehicle. In one embodiment, for example, system 100 may use a two-camera imaging system, where a first camera and a second camera (e.g., image capture devices 122 and 124) may be positioned at the front and/or the sides of a vehicle (e.g., vehicle 200). The first camera may have a field of view that is greater than, less than, or partially overlapping with, the field of view of the second camera. In addition, the first camera may be connected to a first image processor to perform monocular image analysis of images provided by the first camera, and the second camera may be connected to a second image processor to perform monocular image analysis of images provided by the second camera. The outputs (e.g., processed information) of the first and second image processors may be combined. In some embodiments, the second image processor may receive images from both the first camera and second camera to perform stereo analysis. In another embodiment, system 100 may use a three-camera imaging system where each of the cameras has a different field of view. Such a system may, therefore, make decisions based on information derived from objects located at varying distances both forward and to the sides of the vehicle. References to monocular image analysis may refer to instances where image analysis is performed based on images captured from a single point of view (e.g., from a single camera). Stereo image analysis may refer to instances where image analysis is performed based on two or more images captured with one or more variations of an image capture parameter. For example, captured images suitable for performing stereo image analysis may include images captured: from two or more different positions, from different fields of view, using different focal lengths, along with parallax information, etc.

For example, in an embodiment, system 100 may implement a three-camera configuration using image capture devices 122-126. In such a configuration, image capture device 122 may provide a narrow field of view (e.g., 34 degrees, or other values selected from a range of about 20 to 45 degrees, etc.), image capture device 124 may provide a wide field of view (e.g., 150 degrees or other values selected from a range of about 100 to about 180 degrees), and image capture device 126 may provide an intermediate field of view (e.g., 46 degrees or other values selected from a range of about 35 to about 60 degrees). In some embodiments, image capture device 126 may act as a main or primary camera. Image capture devices 122-126 may be positioned behind rearview mirror 310 and positioned substantially side-by-side (e.g., 6 cm apart). Further, in some embodiments, one or more of image capture devices 122-126 may be mounted behind a glare shield that is flush with the windshield of vehicle 200. Such shielding may act to minimize the impact of any reflections from inside the car on image capture devices 122-126.

In another embodiment, the wide field of view camera (e.g., image capture device 124 in the above example) may be mounted lower than the narrow and main field of view cameras (e.g., image devices 122 and 126 in the above example). This configuration may provide a free line of sight for the wide field of view camera. To reduce reflections, the cameras may be mounted close to the windshield of vehicle 200, and may include polarizers on the cameras to reduce reflected light.

A three-camera system may provide certain performance characteristics. For example, some embodiments may include an ability to validate the detection of objects by one camera based on detection results from another camera. In the three-camera configuration discussed above, processing unit 110 may include, for example, three processing devices (e.g., three EyeQ series of processor chips, as discussed above), with each processing device dedicated to processing images captured by one or more of image capture devices 122-126.

In a three-camera system, a first processing device may receive images from both the main camera and the narrow field of view camera, and perform processing of the narrow FOV camera or even a cropped FOV of the camera. In some embodiments, the first processing device can be configured to use a trained system (e.g., a trained neural network) to detect objects and/or road features (commonly referred to as "road objects"), predict a vehicle's path, etc. ahead of a current location of a vehicle.

The first processing device can be further adapted to preform image processing tasks, for example, which can be intended to detect other vehicles, pedestrians, lane marks, traffic signs, traffic lights, and other road objects. Still further, the first processing device may calculate a disparity of pixels between the images from the main camera and the narrow camera and create a 3D reconstruction of the environment of vehicle 200. The first processing device may then combine the 3D reconstruction with 3D map data (e.g., a depth map) or with 3D information calculated based on information from another camera. In some embodiments, the first processing device can be configured to use the trained system on depth information (for example the 3D map data), in accordance with examples of the presently disclosed subject matter. In this implementation the system can be trained on depth information, such as 3D map data.

The second processing device may receive images from main camera and can be configured to perform vision processing to detect other vehicles, pedestrians, lane marks, traffic signs, traffic lights, road barriers, debris and other road objects. Additionally, the second processing device may calculate a camera displacement and, based on the displacement, calculate a disparity of pixels between successive images and create a 3D reconstruction of the scene (e.g., a structure from motion). The second processing device may send the structure from motion-based 3D reconstruction to the first processing device to be combined with the stereo 3D images or with the depth information obtained by stereo processing.

The third processing device may receive images from the wide FOV camera and process the images to detect vehicles, pedestrians, lane marks, traffic signs, traffic lights, and other road objects. The third processing device may execute additional processing instructions to analyze images to identify objects moving in the image, such as vehicles changing lanes, pedestrians, etc.

In some embodiments, having streams of image-based information captured and processed independently may provide an opportunity for redundancy in the system. Such redundancy may include, for example, using a first image capture device and the images processed from that device to validate and/or supplement information obtained by capturing and processing image information from at least a second image capture device.

In some embodiments, system 100 may use two image capture devices (e.g., image capture devices 122 and 124) in providing navigation assistance for vehicle 200 and use a third image capture device (e.g., image capture device 126) to provide redundancy and validate the analysis of data received from the other two image capture devices. For example, in such a configuration, image capture devices 122 and 124 may provide images for stereo analysis by system 100 for navigating vehicle 200, while image capture device 126 may provide images for monocular analysis by system 100 to provide redundancy and validation of information obtained based on images captured from image capture device 122 and/or image capture device 124. That is, image capture device 126 (and a corresponding processing device) may be considered to provide a redundant sub-system as a check on the analysis derived from image capture devices 122 and 124 (e.g., to provide an automatic emergency braking (AEB) system).

One of skill in the art will recognize that the above camera configurations, camera placements, number of cameras, camera locations, etc., are examples only. These components and others described relative to the overall system may be assembled and used in a variety of different configurations without departing from the scope of the disclosed embodiments. Further details regarding usage of a multi-camera system to provide driver assist and/or autonomous vehicle functionality follow below.

As will be appreciated by a person skilled in the art having the benefit of this disclosure, numerous variations and/or modifications can be made to the foregoing disclosed examples. For example, not all components are essential for the operation of system 100. Further, any component can be located in any appropriate part of system 100 and the components can be rearranged into a variety of configurations while providing the functionality of the disclosed embodiments. Therefore, the foregoing configurations are examples and, regardless of the configurations discussed above, system 100 can provide a wide range of functionality to analyze the surroundings of vehicle 200 and navigate vehicle 200 or alert a user of the vehicle in response to the analysis.

As discussed below in further detail and according to examples of the presently disclosed subject matter, system 100 may provide a variety of features related to autonomous driving, semi-autonomous driving, and/or driver assist technology. For example, system 100 can analyze image data, position data (e.g., GPS location information), map data, speed data, and/or data from sensors included in vehicle 200. System 100 may collect the data for analysis from, for example, image acquisition unit 120, position sensor 130, and other sensors. Further, system 100 can analyze the collected data to determine whether or not vehicle 200 should take a certain action, and then automatically take the determined action without human intervention or it can provide a warning, alert or instruction which can indicate to a driver that a certain action needs to be taken. Automatic actions can be carried out under human supervision and can be subject to human intervention and/or override. For example, when vehicle 200 navigates without human intervention, system 100 may automatically control the braking, acceleration, and/or steering of vehicle 200 (e.g., by sending control signals to one or more of throttling system 220, braking system 230, and steering system 240). Further, system 100 can analyze the collected data and issue warnings and/or alerts to vehicle occupants based on the analysis of the collected data.

There may be provided a driving related system that may include (a) an integrated circuit (IC) that includes multiple IC conductors, and a IC test unit; (b) a printed circuit board (PCB) that includes multiple PCB conductors; and (c) multiple intermediate conductors (such as but not limited to solder balls) for coupling the multiple IC conductors to the multiple PCB conductors.

As indicated above, the one or more ICs may include the processing unit 110, the application processor 180 and/or the image processor 190.

The PCB may include PCB conductors that are not electrically coupled to the multiple intermediate conductors. A PCB conductor belongs to the PCB.

The IC may include IC conductors that are not electrically coupled to the multiple intermediate conductors. An IC conductor belongs to the IC.

A first group of intermediate conductors, a first group of IC conductors, and a first group of PCB conductors form a first conductive path (also referred to as a first daisy chain).

The first group of intermediate conductors may include one or more intermediate conductors of the multiple intermediate conductors. The first group of IC conductors may include one or more IC conductors of the multiple IC conductors. The first group of PCB conductors may include one or more PCB conductors of the multiple PCB conductors.

The IC test unit may be configured to electrically test a continuity of the first conductive path and generate a continuity fault indication when detecting a discontinuity of the first conductive path. The test may include supplying any test signal (current, voltage, and the like) to the first conductive path and comparing the response of the first conductive path to the test signal. The IC test unit may test the continuity of the first conductive path in various ways.

For example, one end of the first conductive path may be grounded or be coupled to a supply unit that supplies a predefined voltage to the first conductive path. The IC test unit may test the voltage at another end of the first conductive path to determine whether the first conductive path is continuous or not. If, for example, the first end is grounded and the first conductive path is continuous, then IC test circuit will sense that the other end is also grounded. If, for example, the first end is grounded and the first conductive path is non-continuous, then IC test circuit will sense that the other end is not grounded. The same is applicable when the first end is set to another voltage. The other voltage should exceed the expected noise floor such that a disconnected but noisy first conductive path will not be deemed, due to noise, as continuous.

In an example, both ends of the first conductive path may be coupled to the IC test unit and the IC test unit may test the resistance or conductance of the first conductive path.

It should be noted that the first conductive path may be also tested by an external test unit that does not belong to the IC or the PCB. This may use an external port that is positioned at the exterior of the IC or at the exterior of the PCB to allow the external test unit to access and test the first conductive path.

The first conductive path may be tested by PCB test unit, which may be included in another IC that is electrically coupled to the PCB.

The driving related system may be configured to perform a safety measure, in response to a generation of one or more continuity fault indications.

The driving related system may be configured to apply a safety policy that determines how to respond to one or more continuity fault indications. For example, the driving related system may apply the same response to each continuity fault indication, may respond in different ways to multiple continuity fault indications, may respond in a different manner to different patterns of continuity fault indications, and the like. A pattern of continuity fault indications may include the number of continuity fault indications per a time window, the time differences between continuity fault indications, and the like.

Applying the safety policy may include at least one of the following:
  a. Resetting, with or without human intervention, the IC.
  b. Resetting, with or without human intervention, any component of the system.
  c. Stopping, with or without human intervention, the vehicle.
  d. Changing, with or without human intervention, the manner in which the vehicle is driven—for example, slowing down, moving to the slowest traffic lane, generating an audio/visual indication that is perceivable outside the vehicle, generating an audio/visual indication that is perceivable within the vehicle.
  e. Driving, with or without human intervention, the vehicle to a predefined area such as an area in which the vehicle can safely park.
  f. Requesting, with or without human intervention, another system of the vehicle (for example a vehicle computer) to stop the vehicle.
  g. Requesting, with or without human intervention, another system of the vehicle (for example a vehicle computer) to drive the vehicle to a predefined area.
  h. Requesting, with or without human intervention, another system of the vehicle (for example a vehicle computer) to change, the manner in which the vehicle is driven—for example, slowing down, moving to the slowest traffic lane, generating an audio/visual indication that is perceivable outside the vehicle, generating an audio/visual indication that is perceivable within the vehicle.
  i. Instructing, with or without human intervention, another system of the vehicle (for example a vehicle computer) to stop the vehicle.
  j. Instructing, with or without human intervention, another system of the vehicle (for example a vehicle computer) to drive the vehicle to a predefined area.
  k. Instructing, with or without human intervention, another system of the vehicle (for example a vehicle computer) to change, the manner in which the vehicle is driven—for example, slowing down, moving to the slowest traffic lane, generating an audio/visual indication that is perceivable outside the vehicle, generating an audio/visual indication that is perceivable within the vehicle.
  l. Informing, with or without human intervention, other driving related systems of other vehicles about the continuity fault.
  m. Deciding, with or without human intervention, to handover the control of the vehicle to a human driver.
  n. Deciding, with or without human intervention, to take the control of the vehicle from a human driver.
  o. Assisting in handing over the control of the vehicle to a human driver.
  p. Assisting in handing over the control of the vehicle from a human driver.
  q. Requesting and/or instructing another system of the vehicle to handover the control of the vehicle to a human driver.
  r. Requesting and/or instructing another system of the vehicle to handover the control of the vehicle from a human driver.
  s. Requesting, with or without human intervention, another system of the vehicle (for example a vehicle computer) to shut down the vehicle.
  t. Instructing, with or without human intervention, another system of the vehicle (for example a vehicle computer) to shut down the vehicle.
  u. Requesting a driver to shut down the vehicle.
  v. Requesting, with or without human intervention, to have any unit, system, subsystem of the vehicle to enter a safe mode.
  w. Instructing, with or without human intervention, to have any unit, system, subsystem of the vehicle to enter a safe mode.
  x. Requesting a driver to assist in entering any unit, system, subsystem of the vehicle to enter a safe mode.
  y. Having the driving related system (or any unit, subsystem of the driving related system) enter a safe mode.

It will be appreciated, that implementing a safety mode according to the above routines can involve initiating or generating, transmitting and implementing a sequence of commands directed to navigation and/or control systems of the vehicle, which would control the vehicle in a manner set forth above, e.g., slow down the vehicle and bring the vehicle to a complete stop. Such commands can be generated taking into account a current state of the host vehicle (speed, acceleration, yaw rate, roll rate, etc.) and a presence and actions of other objects in the environment of the host vehicle (such as surrounding vehicles, pedestrians), as well as road signs, road markings, traffic lights, curbs, etc.

A safe mode may be an operational mode in which an item (e.g., a driving related system) operates with a reduced risk level in comparison to a non-safe mode. For example, in a safe mode an item may operate without an unreasonable risk (see, for example, ISO 26262—article 1.102). A safe mode may be a degraded operation mode, an intended operation mode or a switched off mode. In a safe mode a part of the functionality may be used and/or some or more components may be inactive or ignored off. The safe mode, or safe state, may vary in content and duration. A few examples of a safe mode may include:
  a. At SOC level, to reset or shut down.
  b. Suppress/disable internal functions.
  c. Provide additional safety diagnostic information which the MCU should act upon.
  d. At system level, disable safety related functions either by switching the SoC off or labelling the data as "unreliable".
  e. Complete a minimum risk maneuver (e.g., to stop on the hard shoulder/side of the road or keep driving until the driver takes back control).
  f. Complete the drive although with degraded performance (e.g., where the driver not assumed to be in the loop).

FIGS. 4-9 illustrate various examples of driving related systems.

It should be noted that any of the driving related systems may be coupled to sensors and may perform various operations related to autonomous driving and/or operations for supporting a driver. For example, the driving related system may detect the environment of a vehicle, may detect obstacles, may control the driving of the vehicle, may handover control of the vehicle to a human driver, may provide alerts (or any type of indications) to a driver to a driver in relation to the environment of the vehicle, and the like.

Figure 4:
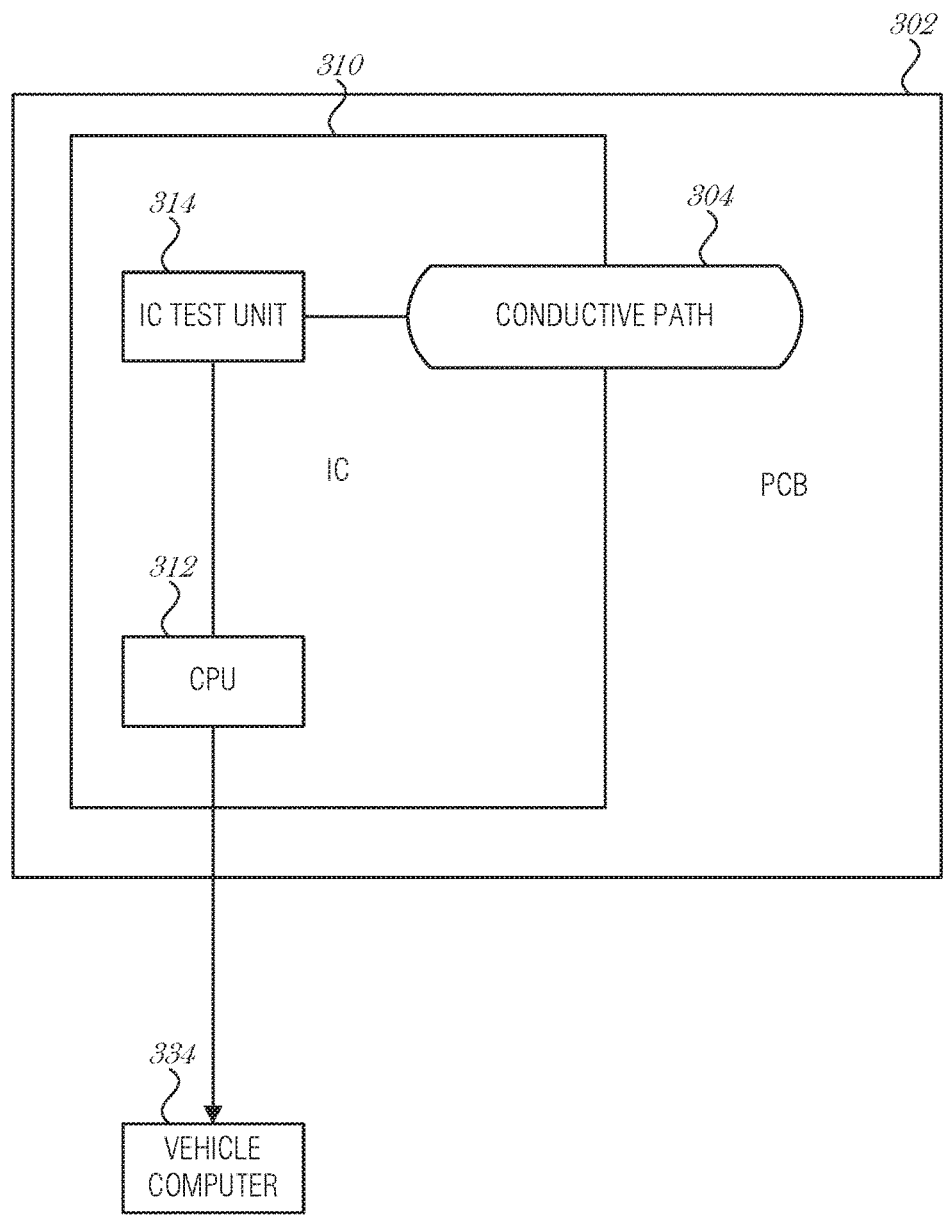
FIG. 4 illustrates an example of a driving related system.

FIG. 4 illustrates a driving related system 300 that includes IC 310 and PCB 302. Intermediate connectors between IC 310 and PCB 302 are not shown for simplicity of explanation. The system includes a first conductive path 304 that includes a first group of intermediate conductors, a first group of IC conductors and a first group of PCB conductors.

IC test unit 314 is configured to electrically test a continuity of the first conductive path 304 and generate a continuity fault indication when detecting a discontinuity of the first conductive path 304.

A central processing unit CPU 312 (that belongs to IC 310) may receive the continuity fault indication and may be configured (alone or in cooperation with vehicle computer 334) to perform a safety measure, in response to a generation of one or more continuity fault indications. It should be noted that the driving related system may be coupled to (and/or cooperate with) any other component of the vehicle—such as another unit, device, system, sub-system, chip, and the like.

The vehicle computer 334 may control one or more systems of the vehicle.

Figure 5:
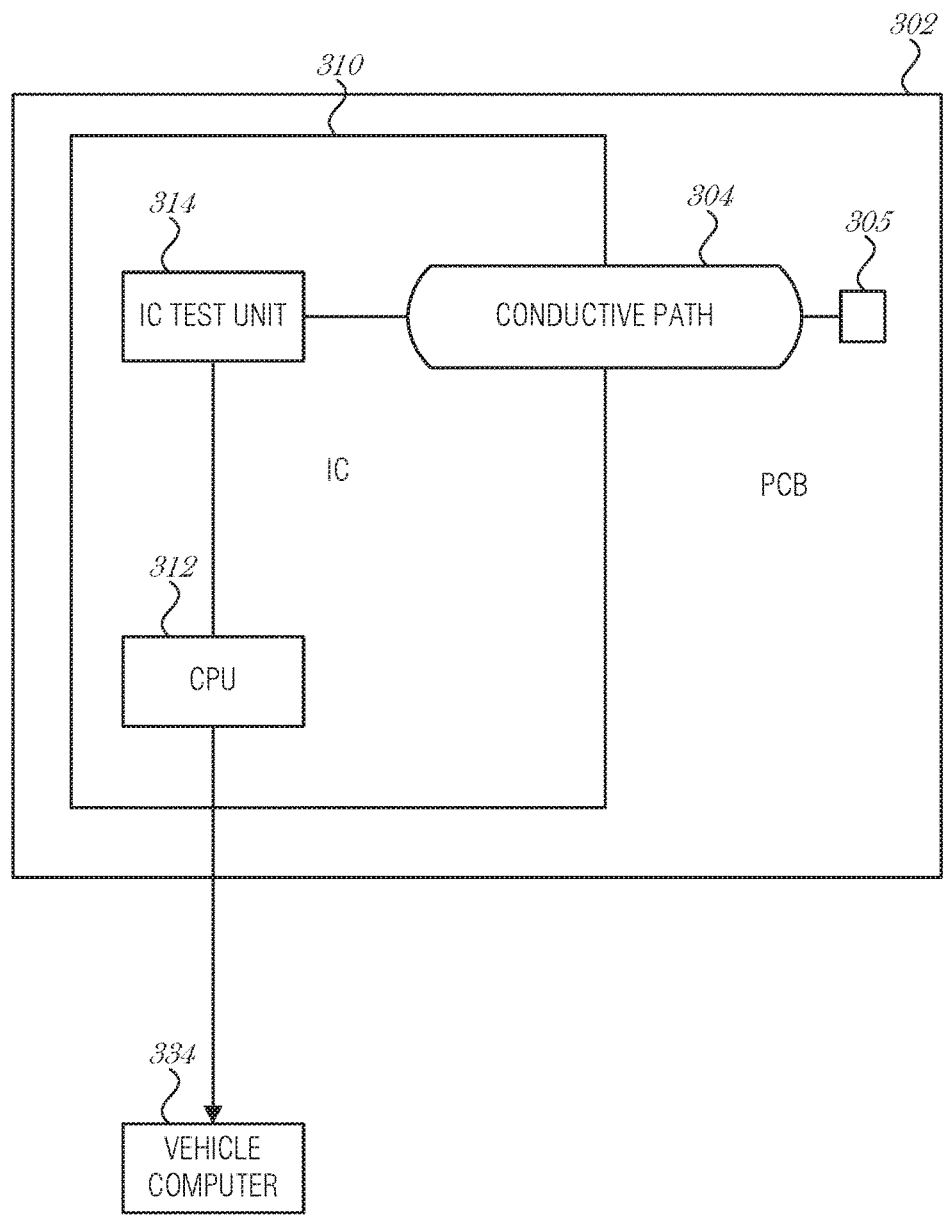
FIG. 5 illustrates an example of a driving related system.

FIG. 5 illustrates a driving related system 300 that differs from the driving related system 300 of FIG. 4 by including a first conductive path 304 that has an external port 305 that allows an external test unit (a test unit not included in IC 310) to electrically test a continuity of the first conductive path 304 and generate a continuity fault indication when detecting a discontinuity of the first conductive path 304.

Figure 6:
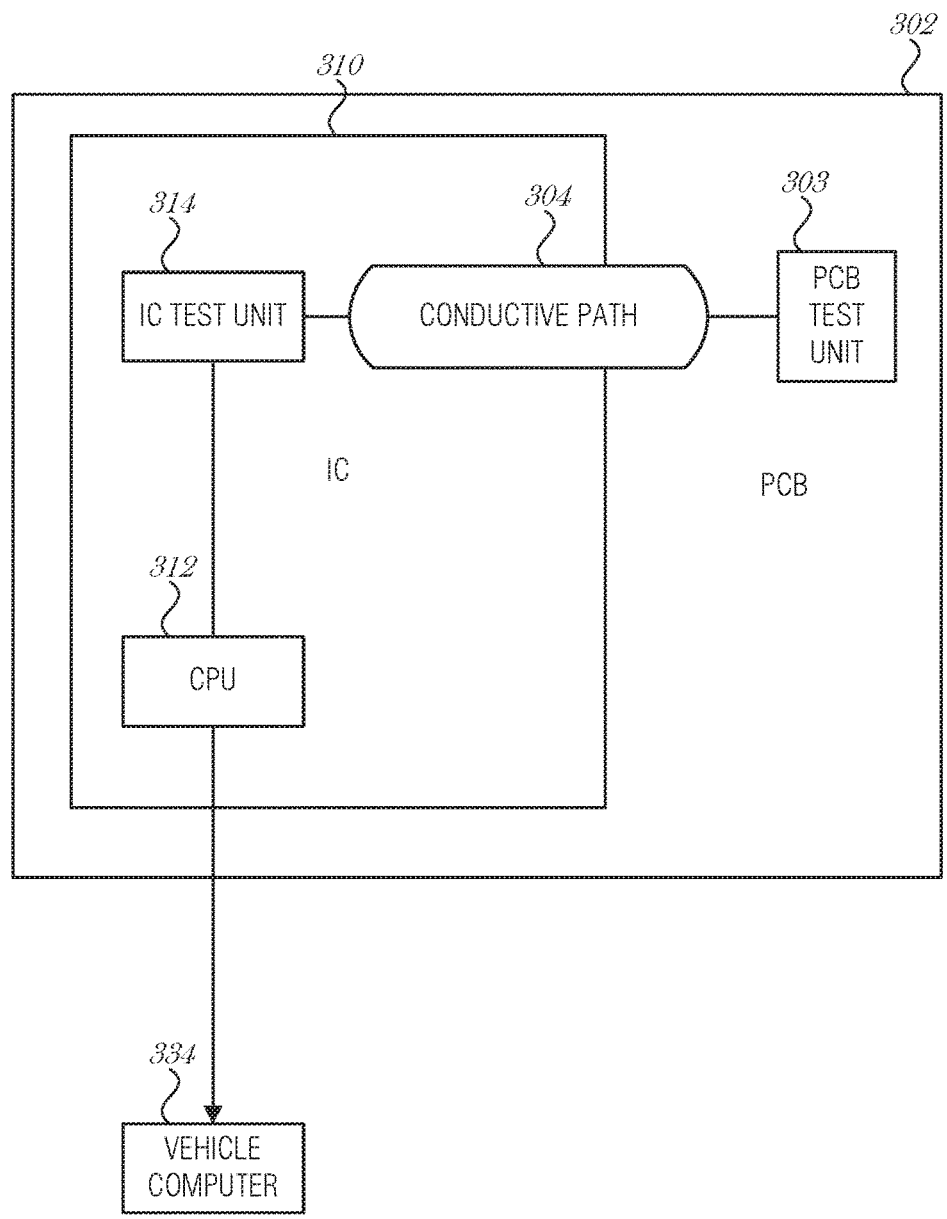
FIG. 6 illustrates an example of a driving related system.

FIG. 6 illustrates a driving related system 300 that differs from the driving related system 300 of FIG. 4 by including a PCB test unit 303 that is configured to electrically test a continuity of the first conductive path 304 and generate a continuity fault indication when detecting a discontinuity of the first conductive path 304. The PCB test unit 303 may belong to another IC that is also mounted on PCB 302.

Figure 7:
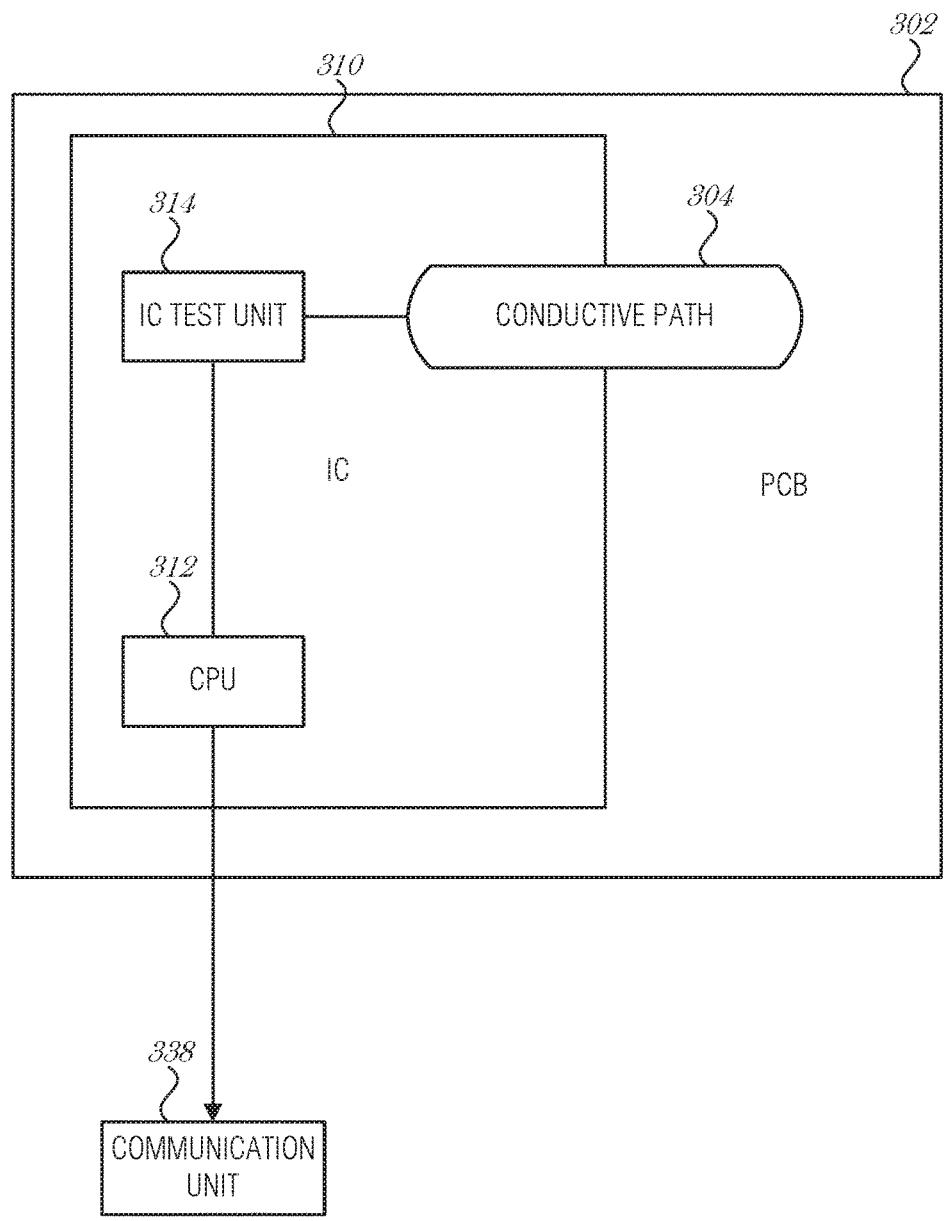
FIG. 7 illustrates an example of a driving related system.

FIG. 7 illustrates a driving related system 300—which includes IC test unit 314, a CPU 312, and conductive path 304—that is coupled to a communication unit 338 of the vehicle. This enables the IC 310 to communicate with other computerized systems (even of other vehicles) and/or generate human perceivable alerts to the driver. Any of the driving related system 300 may be coupled to a vehicle computer 334 and/or to a communication unit 338.

Figure 8:
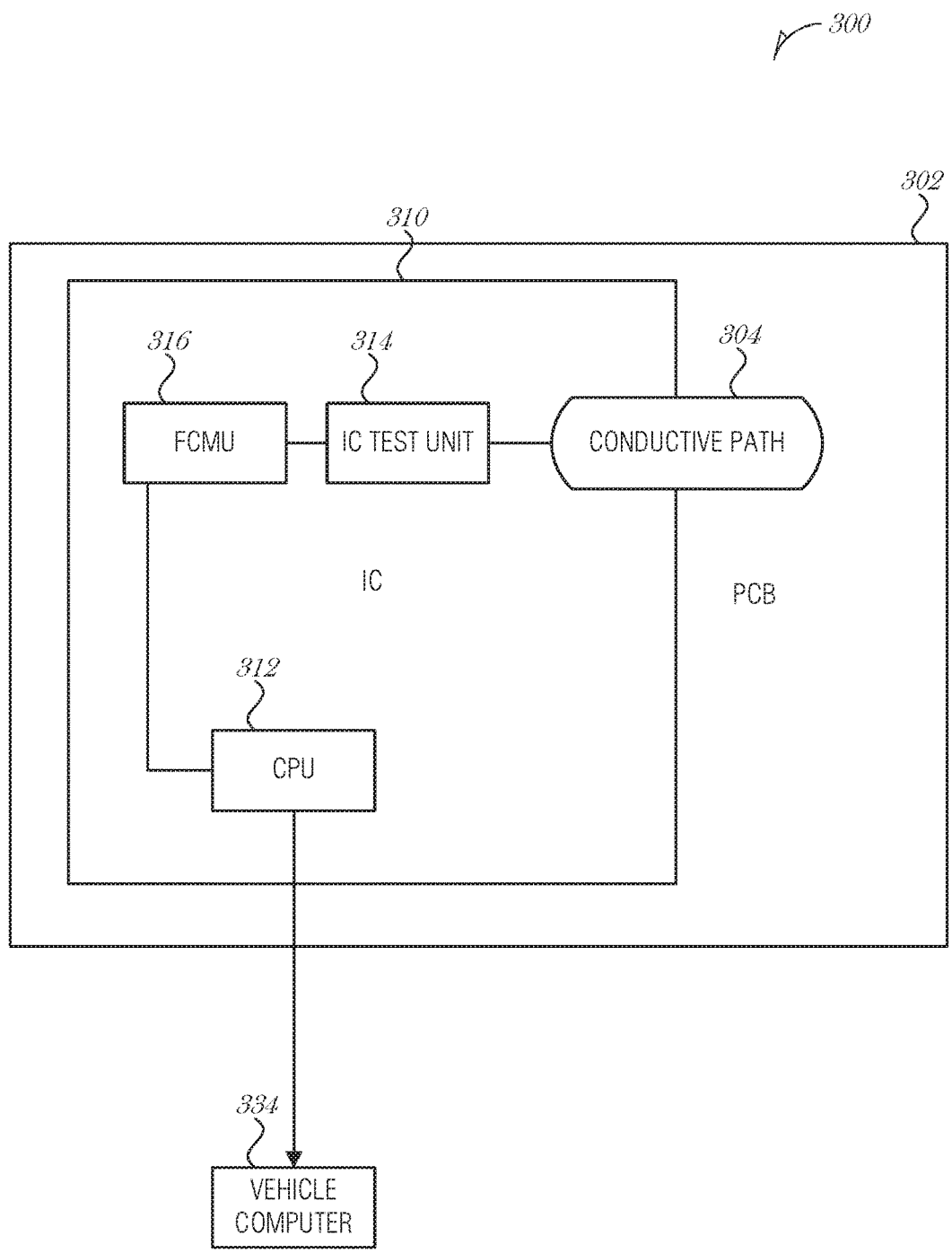
FIG. 8 illustrates an example of a driving related system.

FIG. 8 illustrates a driving related system 300 in which the IC 310 includes an IC test unit 314, a CPU 312, conductive path 304, and a fault collection and management unit (FCMU) 316.

It should be noted that the FCMU 316 may be included in IC 310, may be mounted on PCB 302, may be included in driving related system 300 or may be coupled to driving related system 300.

The IC test unit 314 electrically tests the first conductive path 304 and, if the first conductive path 304 is not continuous, the IC test unit 314 sends the continuity fault indication to the FCMU 316. The FCMU 316 determines how to respond to the continuity fault indication and sends instructions or requests to trigger the desired response to CPU 312. CPU 312 may send requests and/or commands to vehicle computer 334.

Although FIG. 8 illustrates that the FCMU 316 notifies the vehicle computer 334 via the CPU 312, it is understood that the FCMU 316 may notify the vehicle computer 334 directly, via a direct hardware connection between the FCMU 316 and the vehicle computer 334 (such a connection is not shown here for simplicity of explanation).

Figure 9:
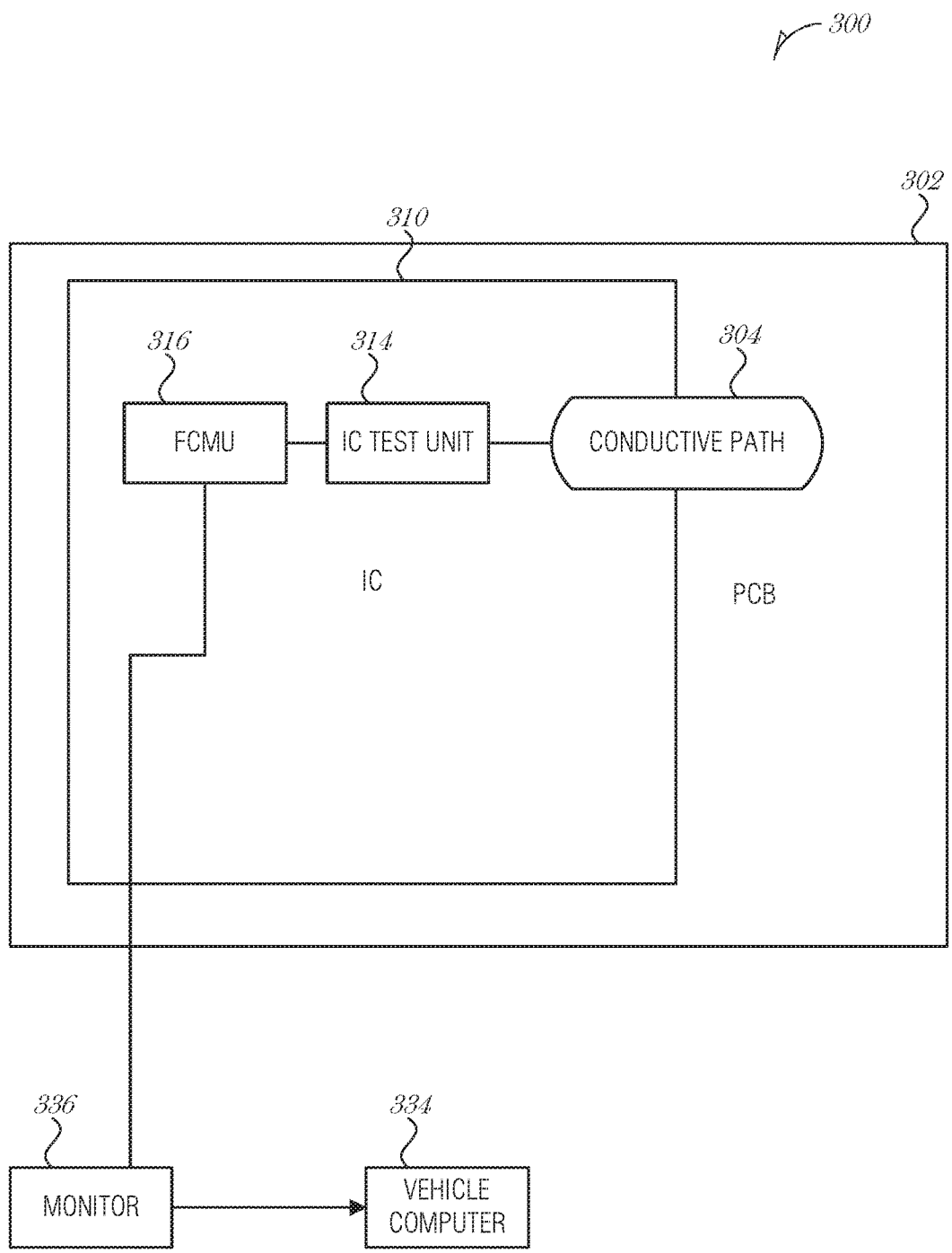
FIG. 9 illustrates an example of a driving related system.

FIG. 9 illustrates a driving related system 300 that differs from the driving related system 300 of FIG. 8 by having an external monitor 336 that is fed by FCMU 316. Here, IC 310 includes an IC test unit 314, a CPU 312, and FCMU 316. The monitor 336 may be replaced by another device, unit, system, subsystem, or a conductive connector.

A non-limiting example of an FCMU 316 is illustrated in PCT/IL2018/050432 titled "SECURE SYSTEM THAT INCLUDES DRIVING RELATED SYSTEMS" which is incorporated herein by reference. In that document, a pair of driving related systems is coupled to a selection circuit for selecting (e.g., based on error reports outputted by the FCMU) which of the driving related systems of the pair to select. In the context of the current application, having a pair of driving related systems that are coupled to such a selection circuit is merely optional.

Figure 10:
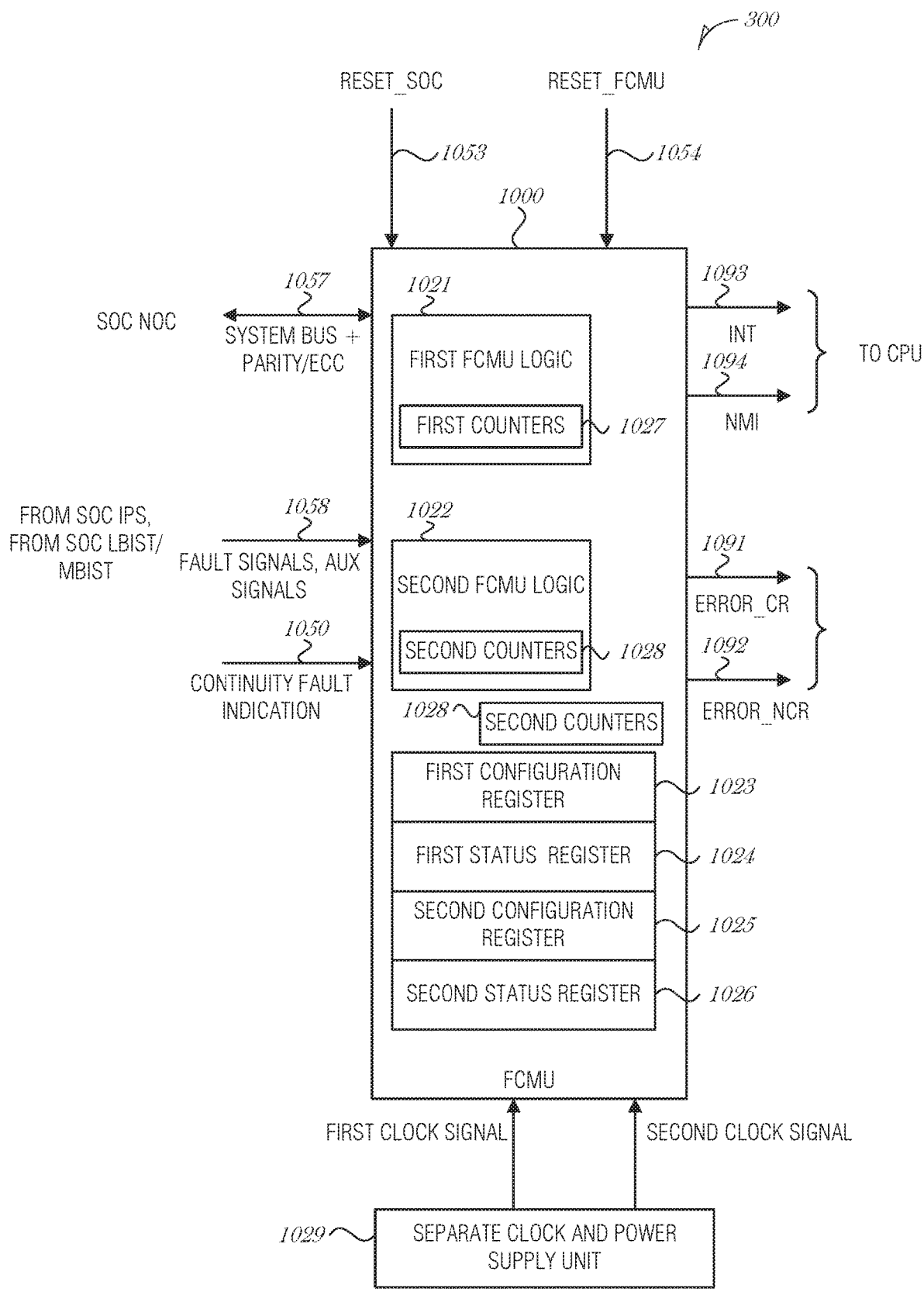
FIG. 10 illustrates an example of a fault collection and management unit.

FIG. 10 illustrates an example of an FCMU 1000. FCMU 1000 includes two ideally identical parts—each part may be fed by a different clock signal and operates independently from the other part. Independently generated and fed clocks signals are harder to tamper without detection by the FCMU 1000. The status monitored by the two parts should be the same so that mismatches between statuses reported by the different parts may indicate of a fault, breach, or another error. The different parts may have different OPC ports and may generate different control signals. Each part includes an FCMU configuration registers, status registers, and the like. It should be noted that the FCMU 1000 may include only a single part (not a pair of ideally identical parts).

FCMU 1000 includes two FCMU logics 1021 and 1022, first and second configuration registers 1023 and 1025, first and second status registers 1024 and 1026. FCMU 1000 is fed by first and second clock signals, which may be provided by clock and power supply unit 1029. FCMU 1000 may receive fault signals from any units/modules/circuits within each driving related module or within each driving related system and/or from external connected devices.

One of the fault signals received by FCMU 1000 is a continuity fault indication 1050 received from an IC test unit. In an example, the continuity fault indication 1050 may be a part of fault signals and Aux signals 1058.

It is assumed in FIG. 10 that the IC into which the FMCU 1000 is integrated is a system on chip (SOC). The SOC may be configured to perform driving related operations. An example of such a SOC is any member of the EyeQ family of Mobileye.

FCMU 1000 may also receive fault signals from software running on internal CPU(s). Internal CPUs belong to an SOC.

FCMU 1000 may receive a large number (e.g., tens, hundreds, or more) of fault and/or status signals and the large number of fault and/or status signals enables the FCMU 1000 to detect, log and report faults in a reliable and quick manner. The status registers 1024 and 1026 may store sticky bits that are indicative of a fault such that once a fault is detected, it may be cleared only by power on reset or by software. The FCMU 1000 may itself include, for example, a CPU and execute software, or a state machine or other hardware logic.

At least some of the registers 1023, 1024, 1025, or 1026 of the FCMU 1000 may be password protected. Thus, programming one or more bits requires reception of a password. The password may be stored in the FCMU 1000. Programming will not be allowed if the wrong password is provided. This may guarantee that these bits are not programmed by error or in a malicious manner.

The first and second FCMU logics 1021 and 1022 receive the fault signals 1050, 1058 and determine whether to generate error signals such as ERROR_CR 1091, ERROR_NCR 1092, interrupt (INT) 1093 and non-maskable interrupt (NMI) 1094. These signals are provided as examples. The number and definition of such signals may be tailored to a particular application.

ERROR_CR 1091 (critical error) and ERROR_NCR 1092 (non-critical error) may be sent outside the driving related system, for example, to a selection module (not shown), to an external monitor, to a vehicle computer, or the like.

The FCMU 1000 may determine that one or more continuity fault indications 1050 represent a critical error (and output ERROR_CR 1091) or a non-critical error (and output ERROR_NCR 1092).

Interrupt signals INT 1093 and NMI 1094 are sent to a CPU of the IC/SOC (e.g., an internal CPU).

The first and second FCMU logics 1021 and 1022 may include counters such as first counters 1027 and second counters 1028.

Fault counters 1027, 1028 may be used for both critical and non-critical faults. Non-critical faults may be treated as tolerable if (for example) they can be recovered from. However, if these faults reach a threshold then they may have severe impact on system performance and should be reported to a SOC CPU and/or external selection module. The fault counters count the number of faults (per each fault type).

Each one of the first and second FCMU logics 1021 and 1022 may include one or more hardware components for implementing rules (that may be programmable and/or otherwise set) for monitoring faults. The monitoring may be based on received fault signals (such as fault signals and/or auxiliary signals from various IPs, and/or such as parity and/or error correction code signals from the SOC) and/or based on tests executed by the FCMU 1000 itself. The rules may be used to determine how to respond to the detected faults.

In FIG. 10 various fault signals 1050, 1058 are provided from built in self-test (BIST) modules (SoC LBIST, MBIST) of the driving related module and/or from the IPs (SoC IPs), and from external connected devices and from SW running on internal CPU(s). For example, fault signals and auxiliary signals 1058 may be provided from SOC IPs and/or from LBIST and/or MBIST. The SOC NOC (interconnect) may provide system bus and parity/ECC signals 1057. For example, faults signals 1058 may include continuity fault indication 1050.

SoC bus level interface such as OCP (and/or AXI, ACE, AHB, APB) and parity signals may be connected to the interconnect (Soc Noc) of the driving related module. These interfaces are used for accessing the FCMU control and status registers for the FCMU maintenance.

The rules may be stored in the FCMU 1000, may be programmed to the FCMU 1000, may change over time, may be fixed and the like.

For example, the rules may define an event and may determine whether the event represents a critical error, whether the event represents a non-critical error, whether the event requires interrupting a CPU of the driving related system, and the like.

An event may be defined when a certain fault occurs once, reoccurs at least a predefined number of times, and/or reoccurs at least a predefined number of times within a time window.

Based on the rules, the FCMU 1000 may determine how to react, for example, to determine when to generate signals such as INT 1093, NMI 1094, ERROR_CR 1091, and ERROR_NCR 1092.

The first RAW logic 1021, first configuration register 1023, and first status register 1024 may be fed by the first clock while the second FCMU logic 1022, second configuration register 1025, and second status register 1026 may be fed by the second clock.

The first and second status registers 1024 and 1026 should reflect the current status of the first driving related system. The current status should reflect faults or an absence of faults.

The first and second configuration registers 1023 and 1025 should reflect the desired configuration of the first driving related system. This may represent one of more of the mentioned above rules. For example, configuration may include a classification of critical and non-critical errors.

In an example, the configuration registers 1023 and 1025 may include threshold registers that are used to store the thresholds (e.g., per fault type) that, once reached (e.g., reoccurrence of a fault type), should be regarded as an event, and thus should be reported to the selection module.

Using two different clocks from separate clock and power supply unit 1029 may improve the robustness of the FCMU 1000, and may increase its immunity to clock signal tamper attempts.

The content of the first and second configuration registers 1023 and 1025 may be compared to each other to find errors (e.g., a mismatch may be treated as an error). The content of the first and second status registers 1024 and 1026 may be compared to each other to find errors (e.g., a mismatch may be indicative of an error).

The first and second clock signals may be provided from a separate clock and supply unit 1029. According to embodiments of the present disclosure, the FCMU 1000 is able to function and not be reset even when the other circuits of the driving related module are reset. Rather, the FCMU 1000 operates from a different reset signal 1054 than the reset signal 1053 used to reset other components.

Furthermore, the FCMU 1000 may store statuses of other components (such as IPs of SOC) of the driving related system—including faults, such as after the other components of the driving related system, it is possible to find out which block led to the malfunction. The same applied to other components of the driving related modules—and even to the entire driving related module or system (e.g., when the FCMU 1000 is not included in the driving related system or module).

Non-limiting examples of fault signals 1058 that may be sent from these one or more cores (also referred to as IPs) to the FCMU 1000 may include (the fault types provided below are examples, other types may be defined):
    a. Continuity fault indication.
    b. Integrity check fault. Indicates that an integrity error was detected by an IP.
    c. SRAM correctable data fault. Indicates one of the SRAM in the IP detected a correctable data error (i.e., ECC Single bit error that was corrected by the IP). This may be regarded as a non-critical fault.
d. SRAM uncorrectable data fault. Indicates one of the SRAM in the IP detected an uncorrectable data error (i.e., ECC detected more errors that can be corrected by the IP). This may be regarded as a critical fault.
e. uncorrectable address fault. Indicates one of the SRAM in the IP detected an uncorrectable address error, (i.e., ECC detected more errors that can be corrected by the IP). This may be regarded as a critical fault.
f. Data path fault. Indicates a parity error was detected by the IP in the data path.
g. Address path fault. Indicates a parity error was detected by the IP in the address path.
h. Configuration registers fault. Indicates a parity error was detected by the IP m the configuration registers.
i. Status Register Fault. Indicates a parity error was detected by the IP in the status registers.
j. Transaction time-out (internal interface, e.g. OCP/AXI/AHB etc.). Indicates a transaction timeout error was detected by the IP.
k. Protocol Fault (external interface, e.g. PCIe, Ethernet, SPI etc.). Indicates a protocol error was detected by the IP.
l. Address violation fault. Indicates an address access violation was detected by the IP.
m. LBIST (Logic Built In Self-Test) Fault. LBIST was run on one of the accelerators or cores and returned a FAIL to the CPU, which raises an LBIST Fault by software.
n. MBIST (Memory Built In Self-Test) Fault. MBIST Fault—MBIST was run on one of the embedded memories and returned a FAIL to the CPU, which raises an MBIST Fault by software.

The mentioned above fault signals may be defined (in a secure manner that is hard to change as critical faults or non-critical faults).

The FCMU 1000 may receive the following Auxiliary Signals 1058:
a. Interrupt/Reset from WatchDog Timer. An interrupt/request sent by a watchdog timer, which indicates an expiration of a predefined period without an occurrence of a predefined action.
b. Security violation events—an event upon which the hardware security module alerts the CPU of a potential security threat, for example, authentication failure.

The fault signals may be semi-static. A fault signals may be semi-static in the sense that it may be set to a certain level following a detection of a fault but may be reset to another level (indicating that the fault does not exist) only by authorized entities such as the FCMU 1000 itself.

The first conducting path may include one or more first corner intermediate conductors. A first corner intermediate conductor is proximate to a corner of the IC. Proximate may mean within a small distance from the corner of the IC. The small distance may be below 5% of a width of the PCB, may be below 5% of the width of the IC, and the like. The first corner intermediate conductor may be closer to the corner of the IC than a majority (for example 90%) of any of the intermediate conductors. The first corner intermediate conductor may be within the ten closest intermediate conductors to the corner of the IC.

The first conducting path may include a first plurality of first sub-groups of first corner intermediate conductors. Each first sub-group is related to a unique corner of the IC such so that different first sub-groups are proximate to different corners of the IC.

Figure 11:
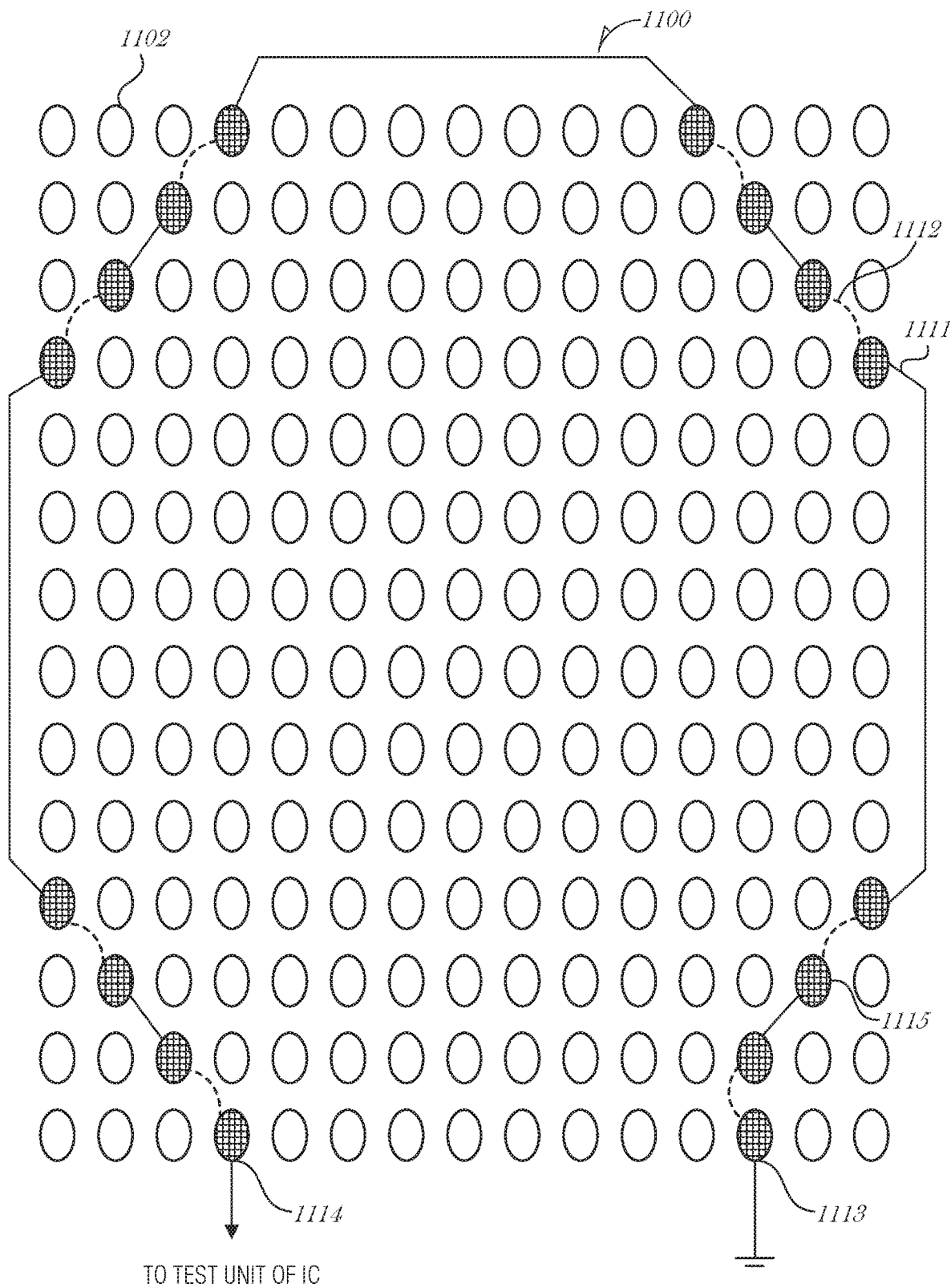
FIG. 11 illustrates an example of a first conductive path.

FIG. 11 illustrates a conductive path 1100 that includes a first end 1113 that is grounded, a second end 1114 that is coupled to an IC test unit, first IC conductors 1111, first PCB conductors 1112, and first intermediate conductors 1115. Intermediate conductors that are not part of the first conductive path 1100 are denoted 1102.

Figure 12:
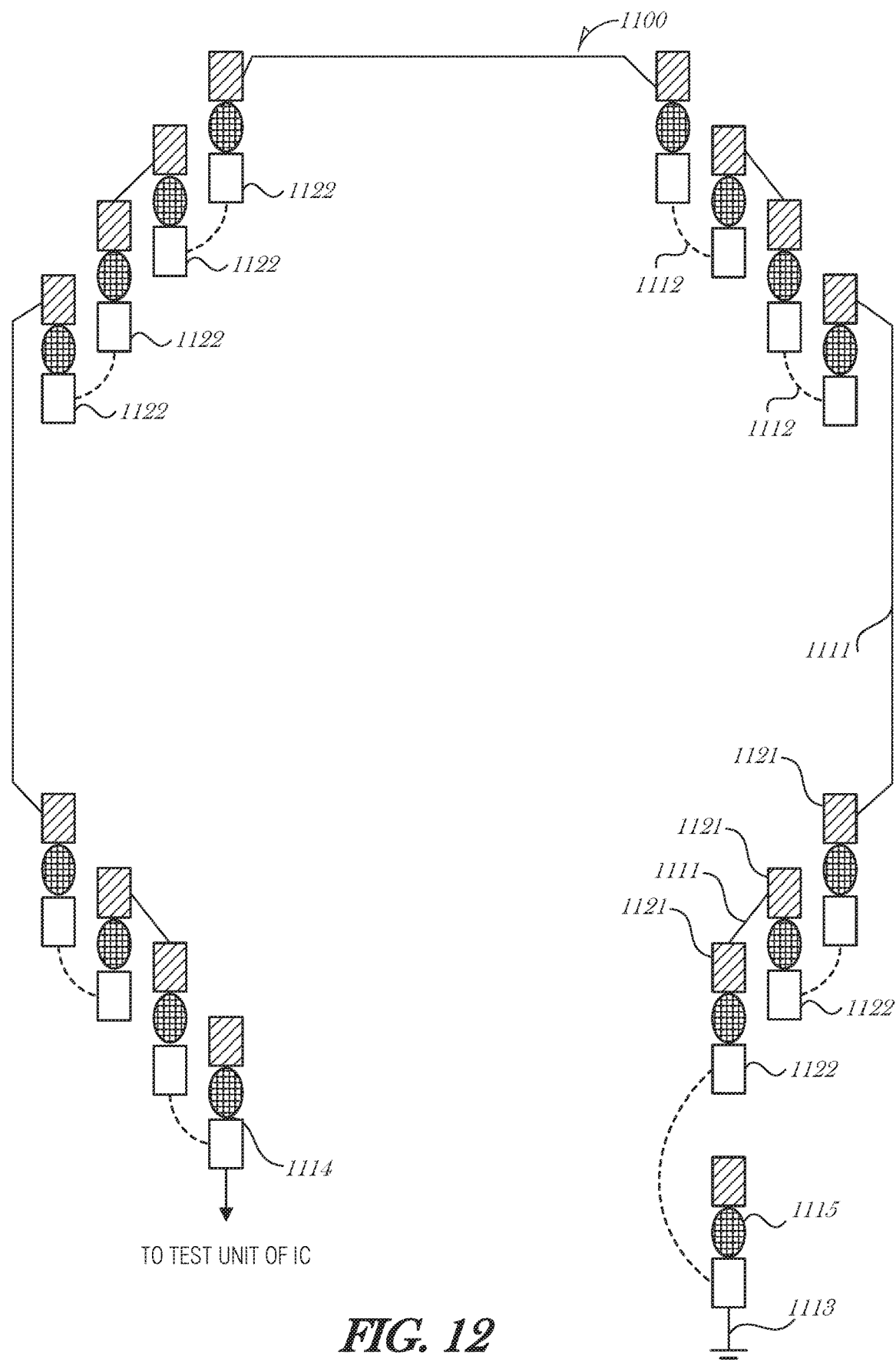
FIG. 12 illustrates an example of a first conductive path.

FIG. 12 illustrates a conductive path 1100 but also illustrates IC ports 1121 and PCB ports 1122 that contact the intermediate conductors 1115.

Figure 13:
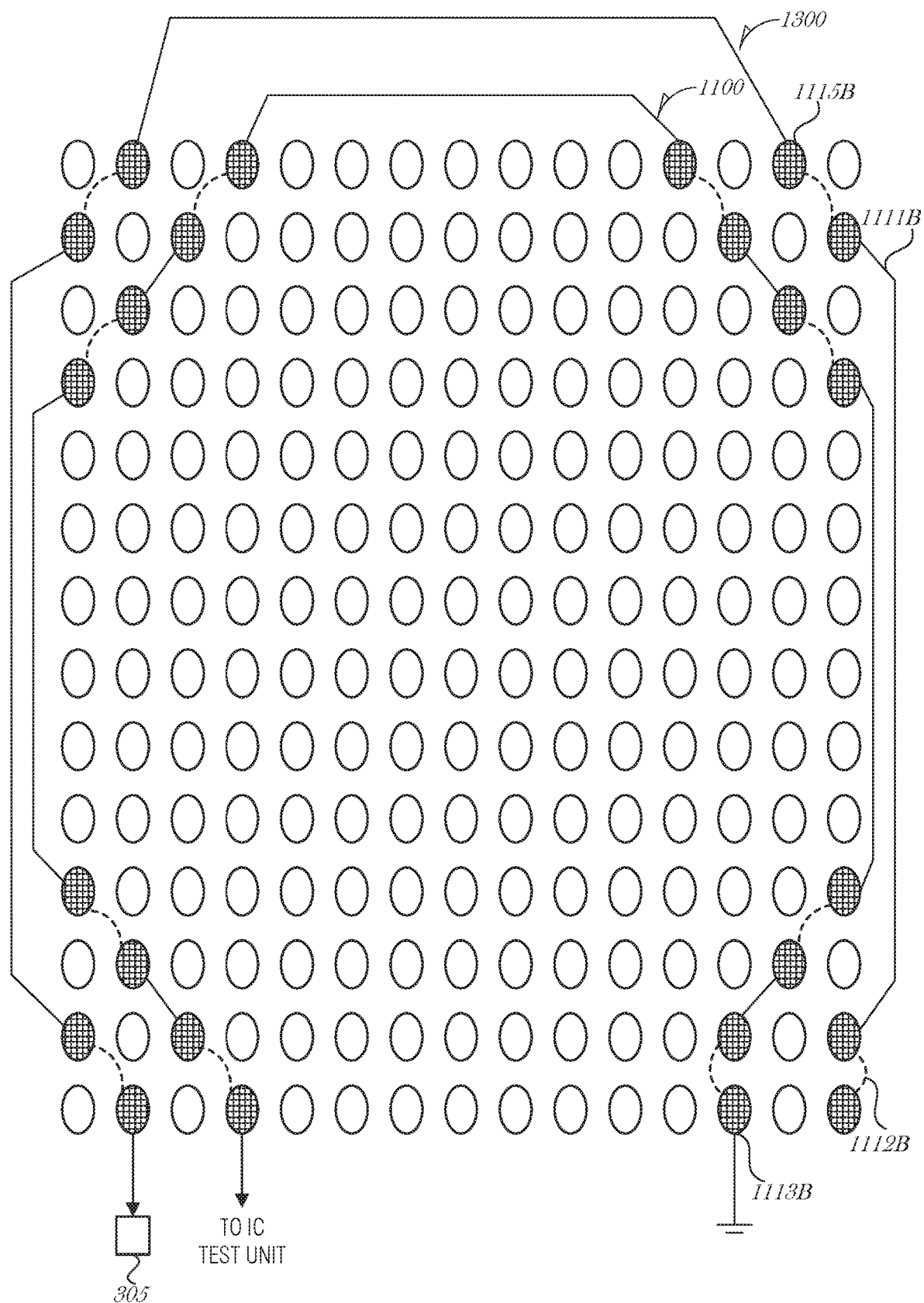
FIG. 13 illustrates an example of a first conductive path and of a second conductive path.

FIG. 13 illustrates first conductive path 1100 and second conductive path 1300 that differs from the first conductive path 1100. The second conductive path 1300 comprises a second group of intermediate conductors 1115B, a second group of IC conductors 1111B and a second group of PCB conductors 1112B. The second conductive path 1300 includes external port 305 that is located at an exterior of at least one of the PCB and the IC. One end 1113B of second conductive path 1300 is grounded.

Figure 14:
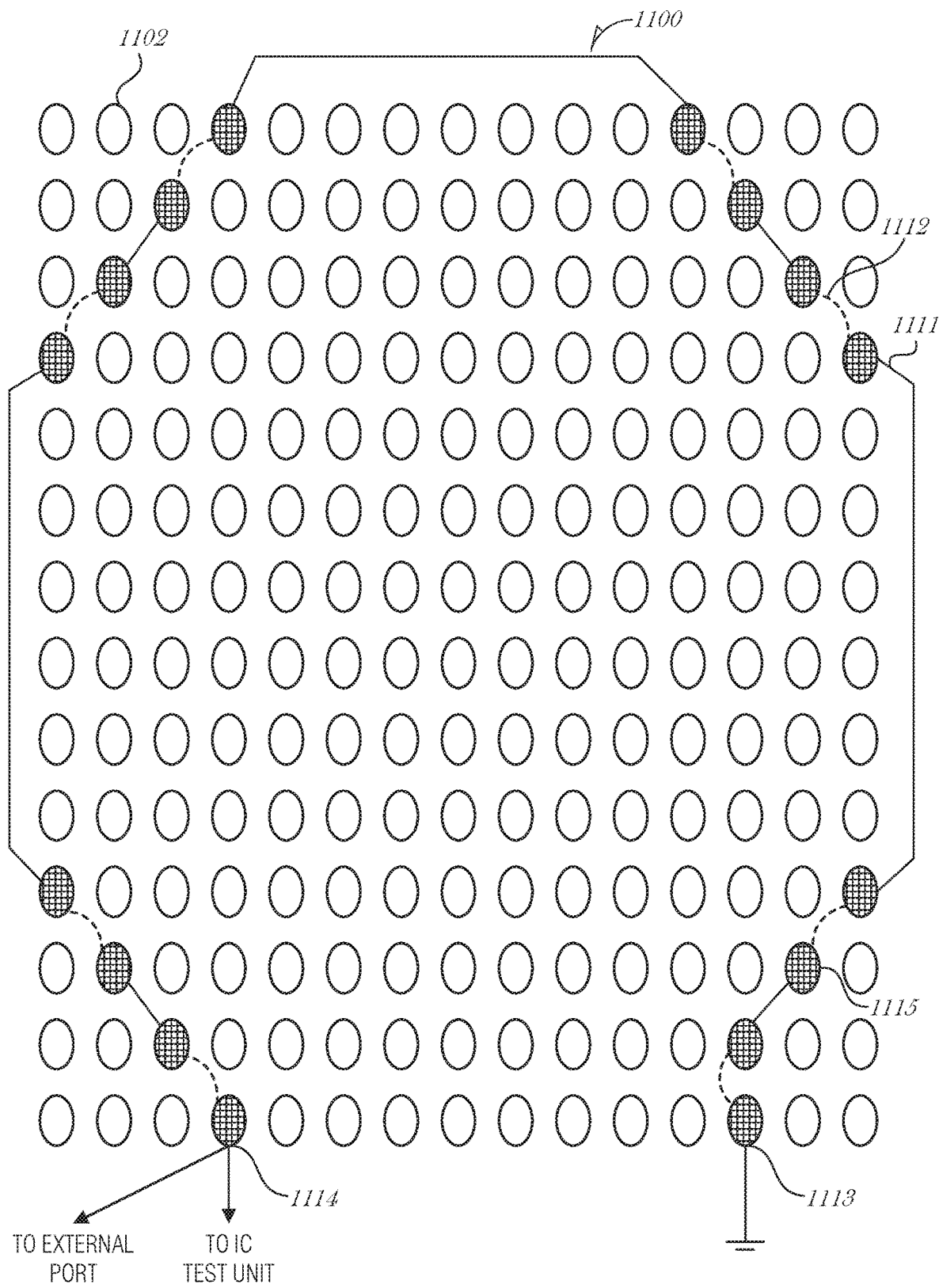
FIG. 14 illustrates an example of a first conductive path.

FIG. 14 illustrates a first conductive path 1100 that includes a first end 1113 that is grounded, a second end 1114 that is coupled to an IC test unit and to an external port, first IC conductors 1111, first PCB conductors 1111, and first intermediate conductors 1115.

FIG. 15 illustrates method 1500. Method 1500 is for making a system safer. Method 1500 includes the following operations. Operation 1510 includes electrically testing by a test unit of an integrated circuit (IC) a continuity of a first conductive path that comprises a first group of IC conductors, a first group of printed circuit board (PCB) conductors, and a first group of intermediate conductors that couple the first group of IC conductors to the first group of PCB conductors. Operation 1510 may include testing the continuity of a first conductive path by a PCB test unit that belongs to another IC mounted on the PCB.

Operation 1520 includes the generation, by the test unit, a continuity fault indication when detecting a discontinuity of the first conductive path.

Operation 1530 includes performing, by a driving related system, a safety measure, in response to a generation of one or more continuity fault indications.

Any reference to a system should be applied, mutatis mutandis to a method that is executed by a system and/or to a computer program product that stores instructions that once executed by the system will cause the system to execute the method. The computer program product is non-transitory and may be, for example, an integrated circuit, a magnetic memory, an optical memory, a disk, and the like.

Any reference to method should be applied, mutatis mutandis to a system that is configured to execute the method and/or to a computer program product that stores instructions that once executed by the system will cause the system to execute the method.

Any reference to a computer program product should be applied, mutatis mutandis to a method that is executed by a system and/or a system that is configured to execute the instructions stored in the computer program product.

The term "and/or" is additionally or alternatively.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermediate components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

The phrase "may be X" indicates that condition X may be fulfilled. This phrase also suggests that condition X may not be fulfilled. For example—any reference to a system as including a certain component should also cover the scenario in which the system does not include the certain component.

The terms "including", "comprising", "having", "consisting" and "consisting essentially of" are used in an interchangeable manner. For example—any method may include at least the steps included in the figures and/or in the specification, only the steps included in the figures and/or the specification. The same applies to the system and the mobile computer.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also, for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as "computer systems".

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one as or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements the mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

Any combination of any component of any component and/or unit of system that is illustrated in any of the figures and/or specification and/or the claims may be provided.

Any combination of any system illustrated in any of the figures and/or specification and/or the claims may be provided.

Any combination of steps, operations and/or methods illustrated in any of the figures and/or specification and/or the claims may be provided.

Any combination of operations illustrated in any of the figures and/or specification and/or the claims may be provided.

Any combination of methods illustrated in any of the figures and/or specification and/or the claims may be provided.

ADDITIONAL EXAMPLES

Example 1 is a driving related system that comprises: an integrated circuit (IC) that comprises IC conductors and a test unit; a printed circuit board (PCB) that comprises PCB conductors; intermediate conductors for coupling the IC conductors to the PCB conductors; wherein the test unit is configured to: electrically test a continuity of a first conductive path that comprises a first group of intermediate conductors, a first group of IC conductors, and a first group of PCB conductors; and generate a continuity fault indication when a discontinuity of the first conductive path is detected; and wherein the driving related system is configured to perform a safety measure in response to the continuity fault indication.

In Example 2, the subject matter of Example 1 includes, wherein the first conductive path is grounded at one end.

In Example 3, the subject matter of Examples 1-2 includes, wherein the first conductive path is coupled to a supply unit that is grounded at one end.

In Example 4, the subject matter of Examples 1-3 includes, wherein the first group of intermediate conductors comprises one or more first corner intermediate conductors that are proximate to a first corner of the IC.

In Example 5, the subject matter of Examples 1-4 includes, wherein the first group of intermediate conductors comprises first sub-groups of first corner intermediate conductors, wherein different first sub-groups of first corner intermediate conductors are proximate to different corners of the IC.

In Example 6, the subject matter of Examples 1-5 includes, wherein the first conductive path further comprises an external port that is located at an exterior of the PCB.

In Example 7, the subject matter of Examples 1-6 includes, wherein the first conductive path further comprises an external port that is located at an exterior of the IC.

In Example 8, the subject matter of Examples 1-7 includes, wherein the IC is configured to classify the continuity fault indication as a critical error.

In Example 9, the subject matter of Examples 1-8 includes, wherein the IC is configured to classify the continuity fault indication as a non-critical error.

In Example 10, the subject matter of Examples 1-9 includes, wherein the IC is configured to perform the safety measure by resetting the IC.

In Example 11, the subject matter of Examples 1-10 includes, wherein the IC is configured to perform the safety measure by instructing or requesting the vehicle to perform a driving related operation.

In Example 12, the subject matter of Examples 1-11 includes, wherein the IC is configured to perform the safety measure by instructing or requesting the vehicle to shut down.

In Example 13, the subject matter of Examples 1-12 includes, wherein the IC is configured to perform the safety measure by instructing or requesting the vehicle to enter a safe mode.

In Example 14, the subject matter of Examples 1-13 includes, wherein the IC is configured to perform the safety measure by requesting a driver of the vehicle to enter the vehicle to a safe mode.

In Example 15, the subject matter of Examples 1-14 includes, wherein the IC is configured to perform the safety measure by instructing the vehicle to drive to a predefined area and then shut down the vehicle.

In Example 16, the subject flatter of Examples 1-15 includes, wherein the IC is configured to perform the safety measure by requesting a driver of the vehicle to drive to a predefined area and then shut down the vehicle.

In Example 17, the subject matter of Examples 1-16 includes, a second conductive path that differs from the first conductive path, wherein the second conductive path comprises a second group of intermediate conductors, a second group of IC conductors and a second group of PCB conductors, and wherein the second conductive path comprises an external port that is located at an exterior of at least one of the PCB and the IC.

Example 18 is a method comprising: electrically testing, by a test unit of an integrated circuit (IC) a continuity of a first conductive path that comprises a first group of IC conductors, a first group of printed circuit board (PCB) conductors and a first group of intermediate conductors that couple the first group of IC conductors to the first group of PCB conductors; generating, by the test unit, a continuity fault indication when detecting a discontinuity of the first conductive path; and performing, by a driving related system, a safety measure, in response to a generation of one or more continuity fault indications.

In Example 19, the subject matter of Example 18 includes, wherein the first group of intermediate conductors comprises one or more first corner intermediate conductors that are proximate to a first corner of the IC.

In Example 20, the subject matter of Examples 18-19 includes, wherein the first group of intermediate conductors comprises first sub-groups of first corner intermediate conductors, wherein different first sub-groups of first corner intermediate conductors are proximate to different corners of the IC.

In Example 21, the subject matter of Examples 18-20 includes, wherein the first conductive path further comprises an external port that is located at an exterior of the PCB.

In Example 22, the subject matter of Examples 18-21 includes, wherein the first conductive path further comprises an external port that is located at an exterior of the IC.

In Example 23, the subject matter of Examples 18-22 includes, wherein performing the safety measure comprises requesting a driver of the vehicle to enter the vehicle to a safe mode.

In Example 24, the subject flatter of Examples 18-23 includes, wherein performing the safety measure comprises requesting a driver of the vehicle to drive to a predefined area and then shut down the vehicle.

In Example 25, the subject matter of Examples 18-24 includes, wherein the first conductive path further comprises an external port that is located at an exterior of the IC.

In Example 26, the subject matter of Examples 18-25 includes, classifying the continuity fault indication as a critical error.

In Example 27, the subject matter of Examples 18-26 includes, classifying the continuity fault indication as a non-critical error.

In Example 28, the subject matter of Examples 18-27 includes, performing the safety measure by resetting the IC.

In Example 29, the subject matter of Examples 18-28 includes, performing the safety measure by instructing or requesting the vehicle to perform a driving related operation.

In Example 30, the subject matter of Examples 18-29 includes, performing the safety measure by instructing or requesting the vehicle to shut down.

In Example 31, the subject matter of Examples 18-30 includes, performing the safety measure by instructing or requesting the vehicle to enter a safe mode.

In Example 32, the subject matter of Examples 18-31 includes, performing the safety measure by requesting a driver of the vehicle to drive to a predefined area and then shut down the vehicle.

Example 33 is a kit that comprises at least one computer program product that stores instructions for: electrically testing, by a test unit of an integrated circuit (IC), a continuity of a first conductive path that comprises a first group of IC conductors, a first group of printed circuit board (PCB) conductors and a first group of intermediate conductors that couple the first group of IC conductors to the first group of PCB conductors; generating, by the test unit of the IC, a continuity fault indication when detecting a discontinuity of the first conductive path; and performing, by a driving related system, a safety measure, in response to a generation of one or more continuity fault indications.

In Example 34, the subject matter of Example 33 includes, wherein performing the safety measure comprises requesting a driver of the vehicle to enter the vehicle to a safe mode.

In Example 35, the subject matter of Examples 33-34 includes, wherein performing the safety measure comprises requesting a driver of the vehicle to drive to a predefined area and then shut down the vehicle.

In Example 36, the subject matter of Examples 33-35 includes, that stores instructions for classifying the continuity fault indication as a critical error.

In Example 37, the subject matter of Examples 33-36 includes, that stores instructions for classifying the continuity fault indication as a non-critical error.

In Example 38, the subject matter of Examples 33-37 includes, that stores instructions for performing the safety measure by resetting the IC.

In Example 39, the subject matter of Examples 33-38 includes, that stores instructions for performing the safety measure by instructing or requesting the vehicle to perform a driving related operation.

In Example 40, the subject matter of Examples 33-39 includes, that stores instructions for performing the safety measure by instructing or requesting the vehicle to shut down.

In Example 41, the subject matter of Examples 33-40 includes, that stores instructions for performing the safety measure by instructing or requesting the vehicle to enter a safe mode.

In Example 42, the subject matter of Examples 33-41 includes, that stores instructions for performing the safety measure by requesting a driver of the vehicle to drive to a predefined area and then shut down the vehicle.

Example 43 is at least one machine-readable medium including instructions that, when executed by processing circuitry, cause the processing circuitry to perform operations to implement of any of Examples 1-42.

Example 44 is an apparatus comprising means to implement of any of Examples 1-42.

Example 45 is a system to implement of any of Examples 1-42.

Example 46 is a method to implement of any of Examples 1-42.

Moreover, while illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the application. The examples are to be construed as non-exclusive. Furthermore, the steps of the disclosed methods may be modified in any manner, including by reordering steps and/or inserting or deleting steps. It is intended, therefore, that the specification and examples be considered as illustrative only, with a true scope and spirit being indicated by the following claims and their full scope of equivalents.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

What is claimed is:

1. A driving related system that comprises:
    an integrated circuit (IC) that comprises IC conductors and a test unit; a printed circuit board (PCB) that comprises PCB conductors; intermediate conductors for coupling the IC conductors to the PCB conductors;
    wherein the test unit is configured to:
    electrically test a continuity of a first conductive path that comprises a first group of intermediate conductors, a first group of IC conductors, and a first group of PCB conductors, and
    generate a continuity fault indication when a discontinuity of the first conductive path is detected; and wherein the driving related system is configured to perform a safety measure in response to the continuity fault indication, and wherein the IC comprises a fault collection and management unit (FCMU) that comprises two identical FCMU logics, wherein each FCMU logic of the two identical FCMU logics is fed by a different clock signal and operates independently from the other FCMU logic of the two identical FCMU logics, wherein the FCMU is configured to determine whether the continuity fault indication is indicative of a critical error or is indicative of a non-critical error.

2. The driving related system according to claim 1, wherein the first conductive path is grounded at one end.

3. The driving related system according to claim 1, wherein the first conductive path is coupled to a supply unit that is grounded at one end.

4. The driving related system according to claim 1, wherein the first group of intermediate conductors comprises one or more first corner intermediate conductors that are proximate to a first corner of the IC.

5. The driving related system according to claim 1, wherein the first group of intermediate conductors comprises first sub-groups of first corner intermediate conductors, wherein different first sub-groups of first corner intermediate conductors are proximate to different corners of the IC.

6. The driving related system according to claim 1, wherein the first conductive path further comprises an external port that is located at an exterior of the PCB.

7. The driving related system according to claim 1, wherein the first conductive path further comprises an external port that is located at an exterior of the IC.

8. The driving related system according to claim 1, wherein the IC is configured to classify the continuity fault indication as a critical error.

9. The driving related system according to claim 1, wherein the IC is configured to classify the continuity fault indication as a non-critical error.

10. The driving related system according to claim 1, wherein the IC is configured to perform the safety measure by resetting the IC.

11. The driving related system according to claim 1, wherein the IC is configured to perform the safety measure by instructing or requesting a vehicle to perform a driving related operation.

12. The driving related system according to claim 1, wherein the IC is configured to perform the safety measure by instructing or requesting a vehicle to shut down.

13. The driving related system according to claim 1, wherein the IC is configured to perform the safety measure by instructing or requesting a vehicle to enter a safe mode.

14. The driving related system according to claim 1, wherein the IC is configured to perform the safety measure by requesting a driver of a vehicle to enter the vehicle to a safe mode.

15. The driving related system according to claim 1, wherein the IC is configured to perform the safety measure by instructing a vehicle to drive to a predefined area and then shut down the vehicle.

16. The driving related system according to claim 1, wherein the IC is configured to perform the safety measure by requesting a driver of a vehicle to drive to a predefined area and then shut down the vehicle.

17. The driving related system according to claim 1, comprising a second conductive path that differs from the first conductive path, wherein the second conductive path comprises a second group of intermediate conductors, a second group of IC conductors and a second group of PCB conductors, and wherein the second conductive path comprises an external port that is located at an exterior of at least one of the PCB and the IC.

18. A method comprising:
electrically testing, by a test unit of an integrated circuit (IC) a continuity of a first conductive path that comprises a first group of IC conductors, a first group of printed circuit board (PCB) conductors and a first group of intermediate conductors that couple the first group of IC conductors to the first group of PCB conductors;
generating, by the test unit, a continuity fault indication when detecting a discontinuity of the first conductive path; and
performing, by a driving related system, a safety measure, in response to a generation of one or more continuity fault indications,
wherein the IC comprises a fault collection and management unit (FCMU) that comprises two identical FCMU logics, wherein each FCMU logic of the two identical FCMU logics is fed by a different dock signal and operates independently from the other FCMU logic of the two identical FCMU logics, wherein the FCMU is configured to determine whether the continuity fault indication is indicative of a critical error or is indicative of a non-critical error.

19. A kit that comprises at least one computer program product that stores instructions for:
electrically testing, by a test unit of an integrated circuit (IC), a continuity of a first conductive path that comprises a first group of IC conductors, a first group of printed circuit board (PCB) conductors and a first group of intermediate conductors that couple the first group of IC conductors to the first group of PCB conductors;
generating, by the test unit of the IC, a continuity fault indication when detecting a discontinuity of the first conductive path; and
performing, by a driving related system, a safety measure, in response to a generation of one or more continuity fault indications,
wherein the IC comprises a fault collection and management unit (FCMU) that comprises two identical FCMU logics, wherein each FCMU logic of the two identical FCMU logics is fed by a different clock signal and operates independently from the other FCMU logic of the two identical FCMU logics, wherein the FCMU is configured to determine whether the continuity fault indication is indicative of a critical error or is indicative of a non-critical error.

20. The driving related system according to claim 1, wherein the driving related system is configured to determine whether to apply the safety measure based on a pattern of continuity fault indicators, where the pattern is indicative of continuity fault indications per a time window.

* * * * *

UNITED STATES PATENT AND TRADEMARK OFFICE
CERTIFICATE OF CORRECTION

| | | |
|---|---|---|
| PATENT NO. | : 11,953,559 B2 | Page 1 of 1 |
| APPLICATION NO. | : 17/053116 | |
| DATED | : April 9, 2024 | |
| INVENTOR(S) | : Mangell et al. | |

It is certified that error appears in the above-identified patent and that said Letters Patent is hereby corrected as shown below:

In the Claims

In Column 26, Line 58, in Claim 1, after "unit;", insert a linebreak

In Column 26, Line 59, in Claim 1, after "conductors;", insert a linebreak

In Column 28, Line 27, in Claim 18, delete "dock" and insert --clock-- therefor

Signed and Sealed this
Seventeenth Day of June, 2025

Coke Morgan Stewart
*Acting Director of the United States Patent and Trademark Office*